United States Patent
Lien et al.

(10) Patent No.: US 11,417,400 B2
(45) Date of Patent: Aug. 16, 2022

(54) CONTROLLING TIMING AND RAMP RATE OF PROGRAM-INHIBIT VOLTAGE SIGNAL DURING PROGRAMMING TO OPTIMIZE PEAK CURRENT

(71) Applicant: SanDisk Technologies LLC, Addison, TX (US)

(72) Inventors: Yu-Chung Lien, San Jose, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 302 days.

(21) Appl. No.: 16/778,821

(22) Filed: Jan. 31, 2020

(65) Prior Publication Data

US 2021/0241836 A1 Aug. 5, 2021

(51) Int. Cl.
| | | |
|---|---|---|
| *G11C 16/00* | (2006.01) | |
| *G11C 16/26* | (2006.01) | |
| *H01L 27/11556* | (2017.01) | |
| *G11C 5/06* | (2006.01) | |
| *G11C 16/10* | (2006.01) | |

(Continued)

(52) U.S. Cl.
CPC .............. *G11C 16/26* (2013.01); *G11C 5/025* (2013.01); *G11C 5/06* (2013.01); *G11C 16/10* (2013.01); *H01L 27/11556* (2013.01); *H01L 27/11582* (2013.01)

(58) Field of Classification Search
CPC ..... G11C 16/26; G11C 16/24; G11C 16/0483; G11C 7/12; G11C 16/06; G11C 16/3459; G11C 16/10; G11C 16/3454; G11C 7/02; G11C 16/16; G11C 5/025; G11C 5/06; G11C 11/5671; G11C 16/12; G11C 16/14; G11C 16/30; G11C 16/32; G11C 16/3427; G11C 2211/5642
USPC .......... 365/185.11, 203, 185.21, 185.25, 196
See application file for complete search history.

(56) References Cited

U.S. PATENT DOCUMENTS

| | | | |
|---|---|---|---|
| 7,957,197 | B2 | 6/2011 | Nguyen et al. |
| 8,107,298 | B2 | 1/2012 | Mui et al. |
| 8,223,556 | B2 | 7/2012 | Dutta et al. |

(Continued)

OTHER PUBLICATIONS

U.S. Appl. No. 16/418,642, filed May 21, 2019.
U.S. Appl. No. 16/668,886, filed Oct. 30, 2019.

*Primary Examiner* — Thong Q Le
(74) *Attorney, Agent, or Firm* — Vierra Magen Marcus LLP

(57) ABSTRACT

Techniques are described for optimizing the peak current during a program operation by controlling a timing and ramp rate of a program-inhibit voltage signal as a function of a program loop number and/or program progress. A transition voltage between a regulated ramp up rate and an unregulated ramp up rate can also be adjusted. For initial and final sets of program loops in a program operation, the ramp up of the program-inhibit voltage signal can occur early so that it overlaps with operations of sense circuits in updating their latches based on results from a verify test in a previous program loop. For an intermediate set of program loops, the overlap is avoided. The ramp up rate can be larger and the transition voltage smaller for the initial and final sets of program loops compared to the intermediate set of program loops.

20 Claims, 21 Drawing Sheets

(51) Int. Cl.
  *G11C 5/02* (2006.01)
  *H01L 27/11582* (2017.01)

(56) References Cited

U.S. PATENT DOCUMENTS

| | | |
|---|---|---|
| 8,274,838 B2 | 9/2012 | Dutta et al. |
| 8,913,453 B2 * | 12/2014 | Baek .................. G11C 16/26 365/203 |
| 8,995,211 B2 | 3/2015 | Lee |
| 9,553,506 B1 | 1/2017 | Huynh et al. |
| 9,887,011 B1 | 2/2018 | Hung |
| 2015/0221348 A1 | 8/2015 | Tseng et al. |
| 2018/0366178 A1 | 12/2018 | Amarnath et al. |

* cited by examiner

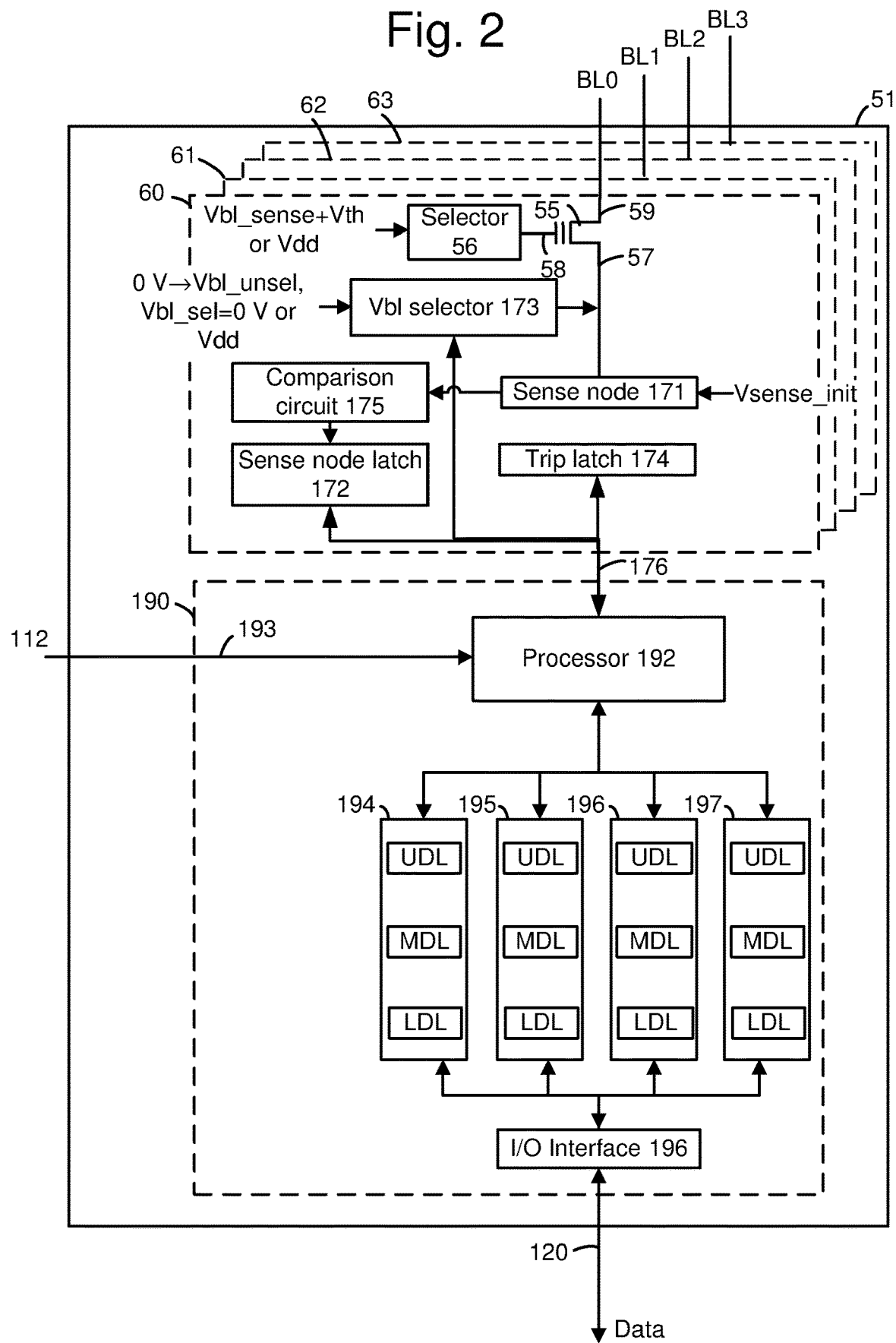

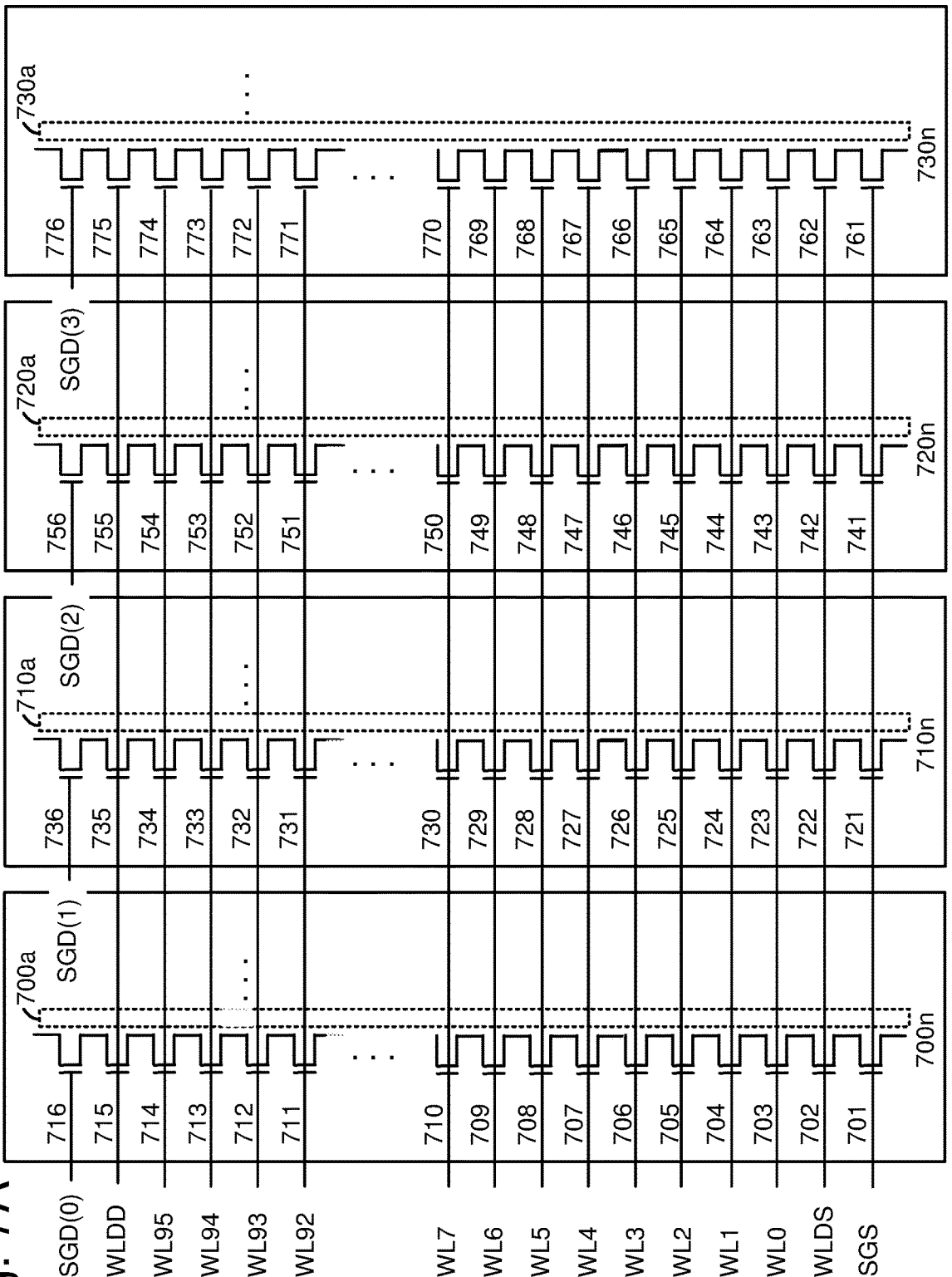

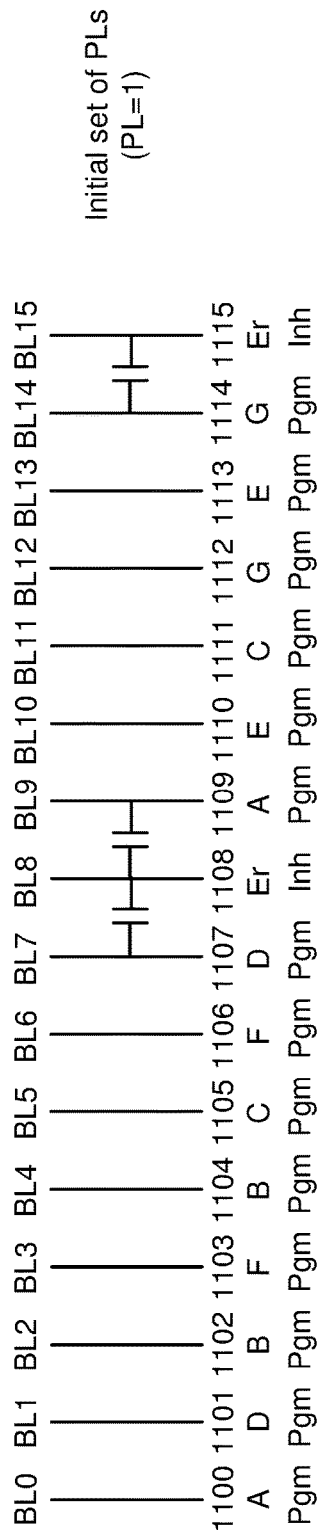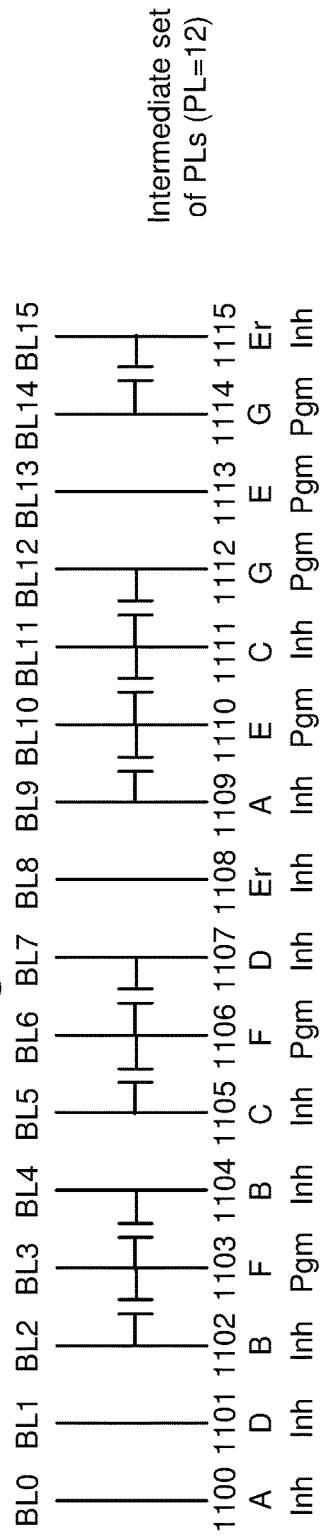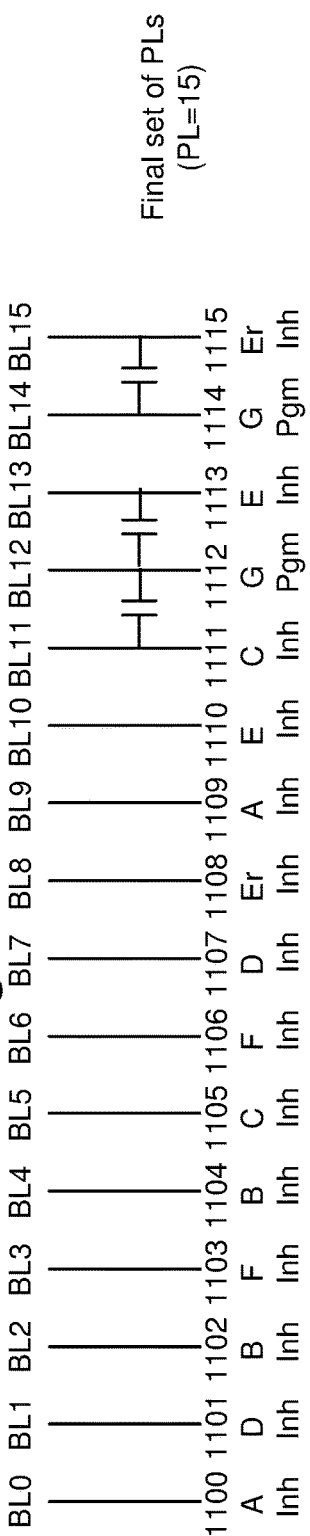

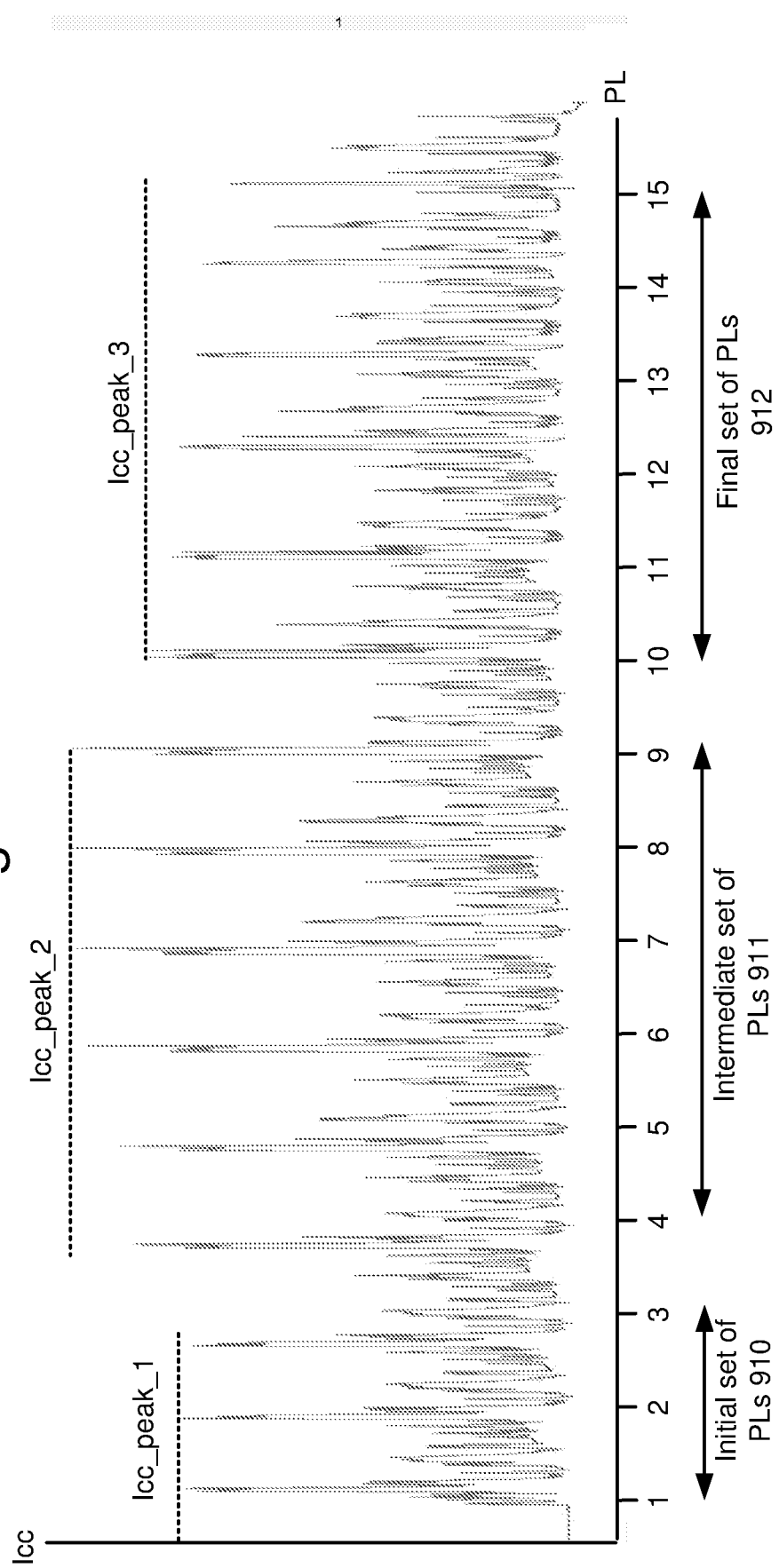

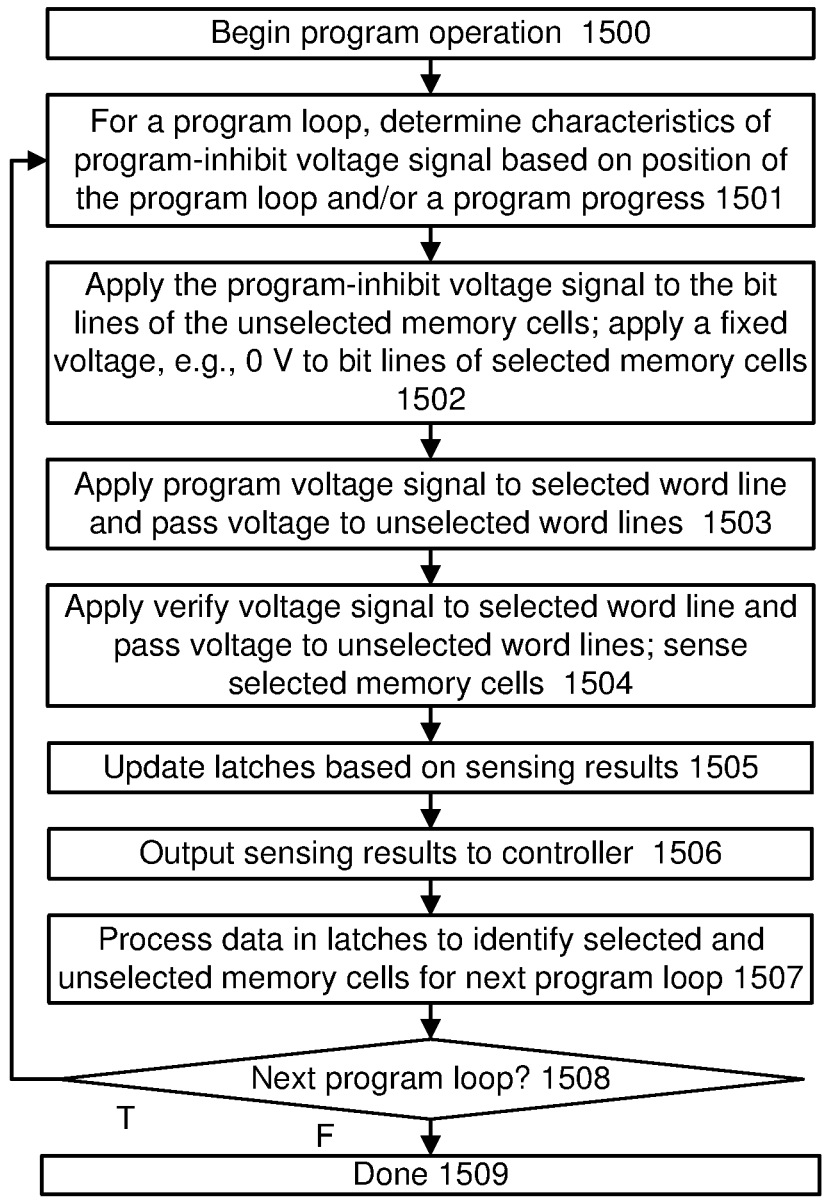

CONTROLLING TIMING AND RAMP RATE OF PROGRAM-INHIBIT VOLTAGE SIGNAL DURING PROGRAMMING TO OPTIMIZE PEAK CURRENT

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 2 is a block diagram depicting one embodiment of the sense block 51 of FIG. 1.

FIG. 7A depicts an example view of NAND strings in a block BLK0 which is consistent with FIGS. 4 and 6A.

FIG. 11A depicts capacitances in a set of bit lines BL0-BL15 due to the ramped up portion 1041*a* of the program-inhibit voltage signal 1041 of FIG. 10, consistent with the initial set of program loops 910 of FIG. 9A.

FIG. 11B depicts capacitances in a set of bit lines BL0-BL15 due to the ramped up portion 1041*a* of the program-inhibit voltage signal 1041 of FIG. 10, consistent with the intermediate set of program loops 911 of FIG. 9A.

FIG. 11C depicts capacitances in a set of bit lines BL0-BL15 due to the ramped up portion 1041*a* of the program-inhibit voltage signal 1041 of FIG. 10, consistent with the final set of program loops 912 of FIG. 9A.

FIG. 12A depicts a plot of current consumption versus time during a program operation, where the program loops are classified into three sets based on current consumption, consistent with FIG. 9A.

FIG. 15A depicts a process for performing a program operation which optimizes program time and current consumption.

DETAILED DESCRIPTION

Apparatuses and techniques are described for optimizing the peak current during a program operation. The optimization can involve controlling a timing and ramp rate of a program-inhibit voltage signal during programming as a function of a program loop number and/or program progress.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

Figure 9A:
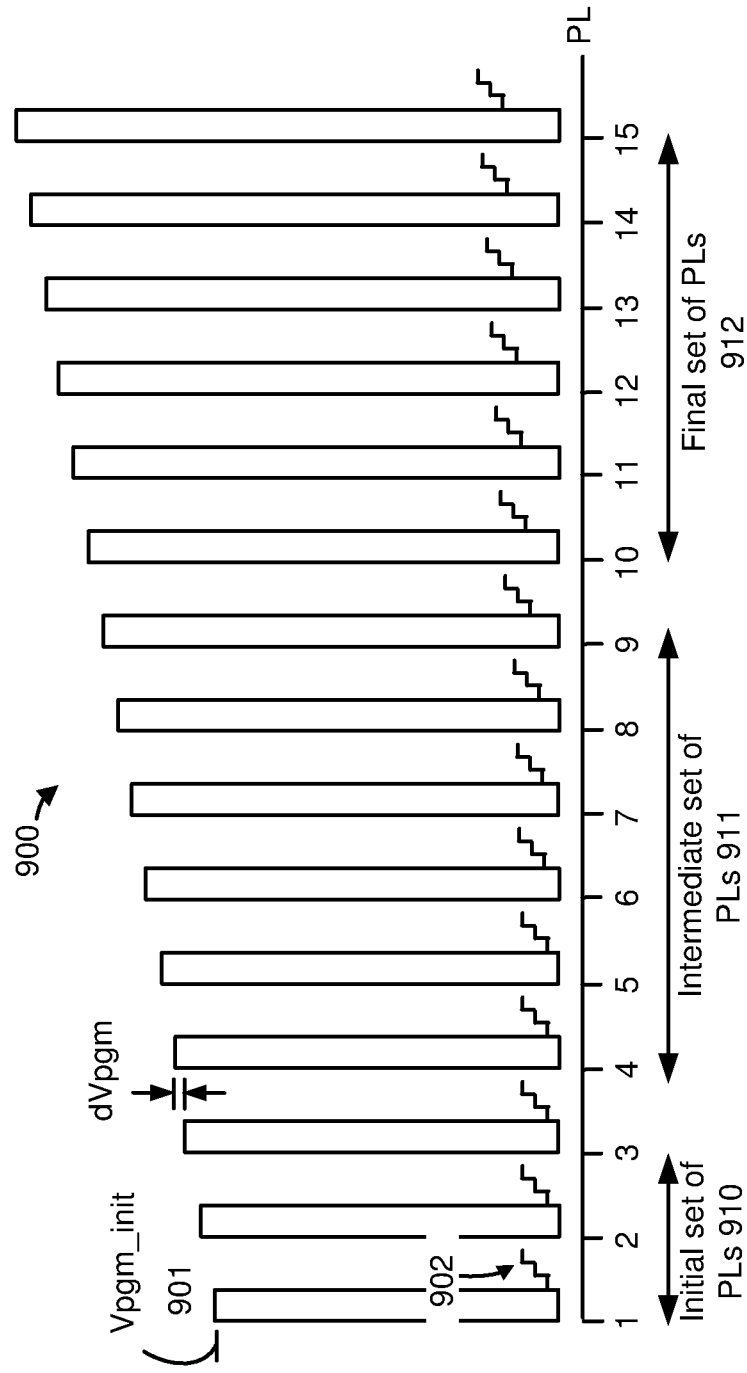
FIG. 9A depicts an example voltage signal used in a program operation, consistent with FIG. 8.
Figure 10:
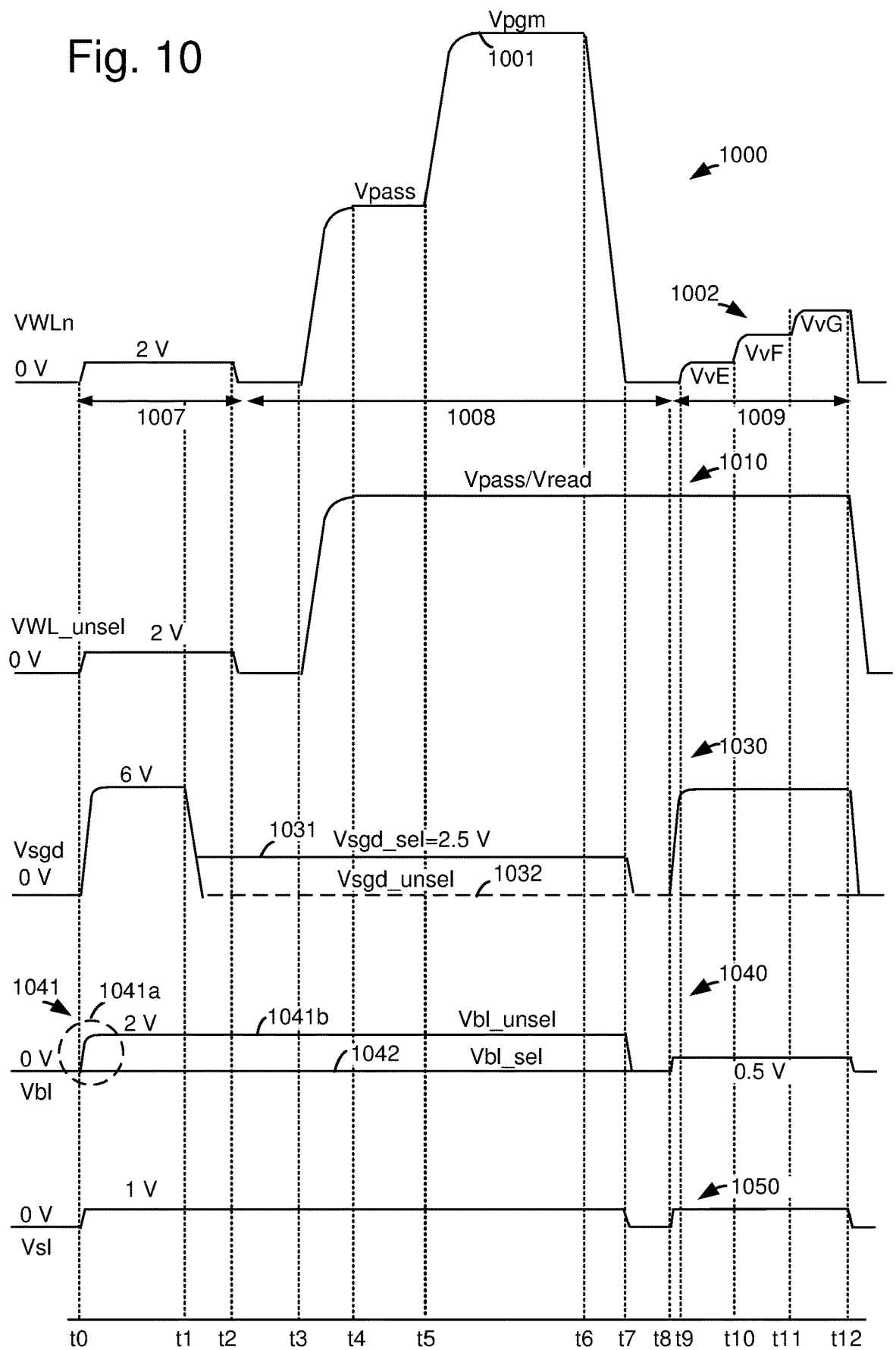
FIG. 10 depicts example voltage signals for performing a program operation, consistent with FIG. 9A.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-blocks (FIG. 7A). For example, a portion of the memory cells of WLn in SB0 are first programmed, followed by a portion of the memory cells of WLn in SB1, a portion of the memory cells of WLn in SB2 and then a portion of the memory cells of WLn in SB3. WLn refers to a word line selected for programming. A programming operation may include one or more sets of increasing program voltages or pulses which are applied to a word line in respective program loops, also referred to as program-verify iterations, such as depicted in FIGS. 9A and 10. Verify tests may be performed after each program voltage to determine whether the memory cells have completed programming. A program loop can include a pre-charge phase 1007, a program phase 1008 and a verify phase 1009, as depicted in FIG. 10.

When programming is completed for a memory cell, it can be locked out from further programming while programming continues for other memory cells in subsequent program loops. One technique for locking out a memory cell from programming is to apply a program-inhibit voltage signal to a bit line connected to the NAND string which contains the memory cell. The program-inhibit voltage signal can be set at a level such as 1-2 V. In one approach, the program-inhibit voltage signal is ramped up to a final level in the pre-charge phase of the program loop and maintained at the final level during the subsequent program phase in which the program pulse is applied to the selected word line. See FIG. 10.

However, there is a conflict between the desire to reduce program time by ramping up the program-inhibit voltage signal quickly and the desire to limit peak current consumption to avoid excessive draining of the battery of the memory device.

Techniques provided herein address the above and other issues. In one aspect, one or more characteristics of a program-inhibit voltage signal are adjusted during a program operation as a function of a program loop number and/or a program progress, to optimize program time and peak current consumption. In one approach, the characteristics result in a relatively high current consumption when the program loop is among an initial and/or final group of program loops, and a relatively low current consumption when the program loop is among an intermediate group of program loops, which is between the initial and final group of program loops. See FIG. 9A. For example, a relatively high current consumption can be associated with a relatively early start of the ramp up of the program-inhibit voltage signal, a relatively high ramp up rate and/or a relatively low transition voltage. See FIG. 13A-13C.

The relatively high current consumption due to the relatively early start of the ramp up of the program-inhibit voltage signal is caused by, e.g., an overlap with operations of the sense circuits in updating their latches based on results from a verify test in a previous program loop.

The relatively high current consumption due to the relatively high ramp up rate is caused by, e.g., the relatively high clock rate of a charge pump in a voltage source used to output the program-inhibit voltage signal.

The transition voltage refers to, e.g., a voltage at which a voltage source transitions from increasing the program-inhibit voltage signal at a regulated rate, which is below a maximum rate, to increasing the program-inhibit voltage signal at an unregulated, maximum rate. The unregulated rate is obtained by a control circuit requesting a step change in the output of the voltage source. The transition voltage can be expressed as a percentage of the final, peak voltage of the program-inhibit voltage signal. A lower transition voltage results in a higher current consumption because there is a greater step increase from the transition voltage to the peak voltage. A lower transition voltage also reduces the program time because the peak voltage is reached sooner than if a higher transition voltage was used.

The techniques are based on an observation that capacitances between bit lines are created when an increasing program-inhibit voltage signal is applied to the unselected bit lines while a fixed program-enable voltage signal, e.g., 0 V, is applied to selected bit lines. In particular, as shown in FIG. 11A-11C, a capacitance is created between a selected bit line which is adjacent to an unselected bit line. Also, the total capacitance between the bit lines varies as a function of program loop number and/or a program progress and this causes a corresponding variation in the current consumption used to ramp up the program-inhibit voltage signal (FIG. 12A). A higher current consumption is used to ramp up the program-inhibit voltage signal when the bit line capacitances are greater.

The techniques are also based on an observation that the ramp up of the program-inhibit voltage signal can overlap with operations of the sense circuits in updating their latches based on results from a verify test in a previous program loop.

These and other features are discussed further below.

Figure 1:
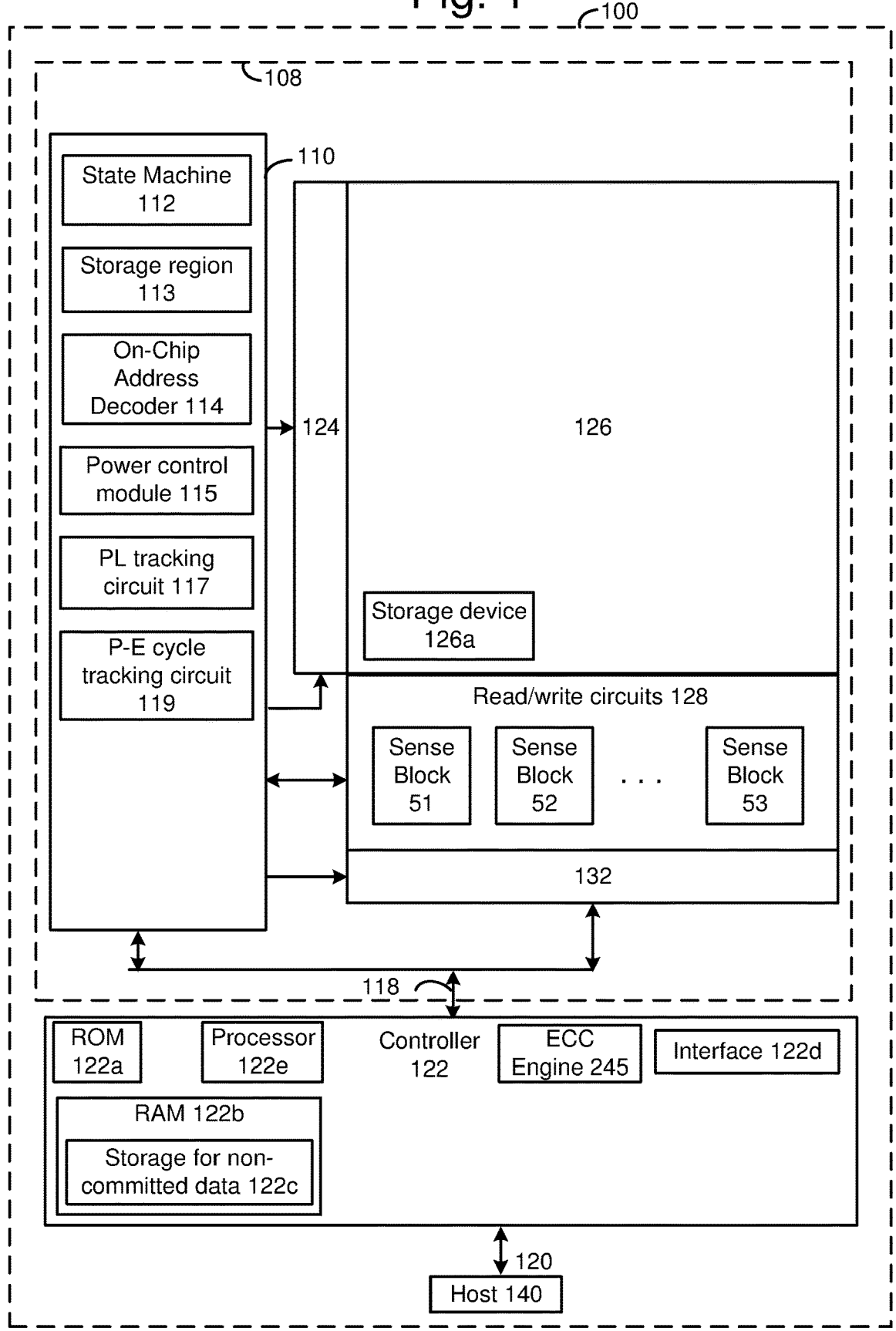
FIG. 1 is a block diagram of an example memory device.

FIG. 1 is a block diagram of an example memory device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, a program loop (PL) tracking circuit 117 and a program-erase (P-E) cycle tracking circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach. The PL tracking circuit 117 can track the current program loop number, determine if a current program loop is in a specified set of program loops such as initial, intermediate or final sets of program loops, and determine a program loop in which a specified amount of program progress has been completed. For example, the tracking circuit can determine a program loop in which verify tests begin or end for a specified data state of a plurality of data states. The Vpgm could also be tracked, since it corresponds to the program loop position.

The P-E cycle tracking circuit 119 can track the number of P-E cycles for a block. This information can be used to define the initial, intermediate and/or final sets of program loops, for example. See, e.g., FIG. 9A.

The circuits 117 and 119 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, PL tracking circuit 117, P-E cycle tracking circuit 119, sense blocks 51, 52, . . . , 53, read/write circuits 128, controller 122, and so forth.

The off-chip controller 122 (which in one embodiment is an electrical circuit) may comprise a processor 122e, storage devices (memory) such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read-only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. See also Vbl in FIG. 10. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one or a number of voltage signals. For example, the Vbl selector can pass a program-inhibit voltage signal which increases from an initial voltage, e.g., 0 V, to a program inhibit voltage, e.g., Vbl_unsel (also referred to as Vbl_inh) for respective bit lines of unselected NAND string during a program loop. The Vbl selector 173 can pass a program-enable voltage signal such as 0 V for respective bit lines of selected NAND strings during a program loop. The Vbl selector may receive voltage signals from the first, second and third voltage sources 440a-440c, respectively, in FIG. 3A, and select one of these signals based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. See also FIGS. 15C and 15D. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3A:
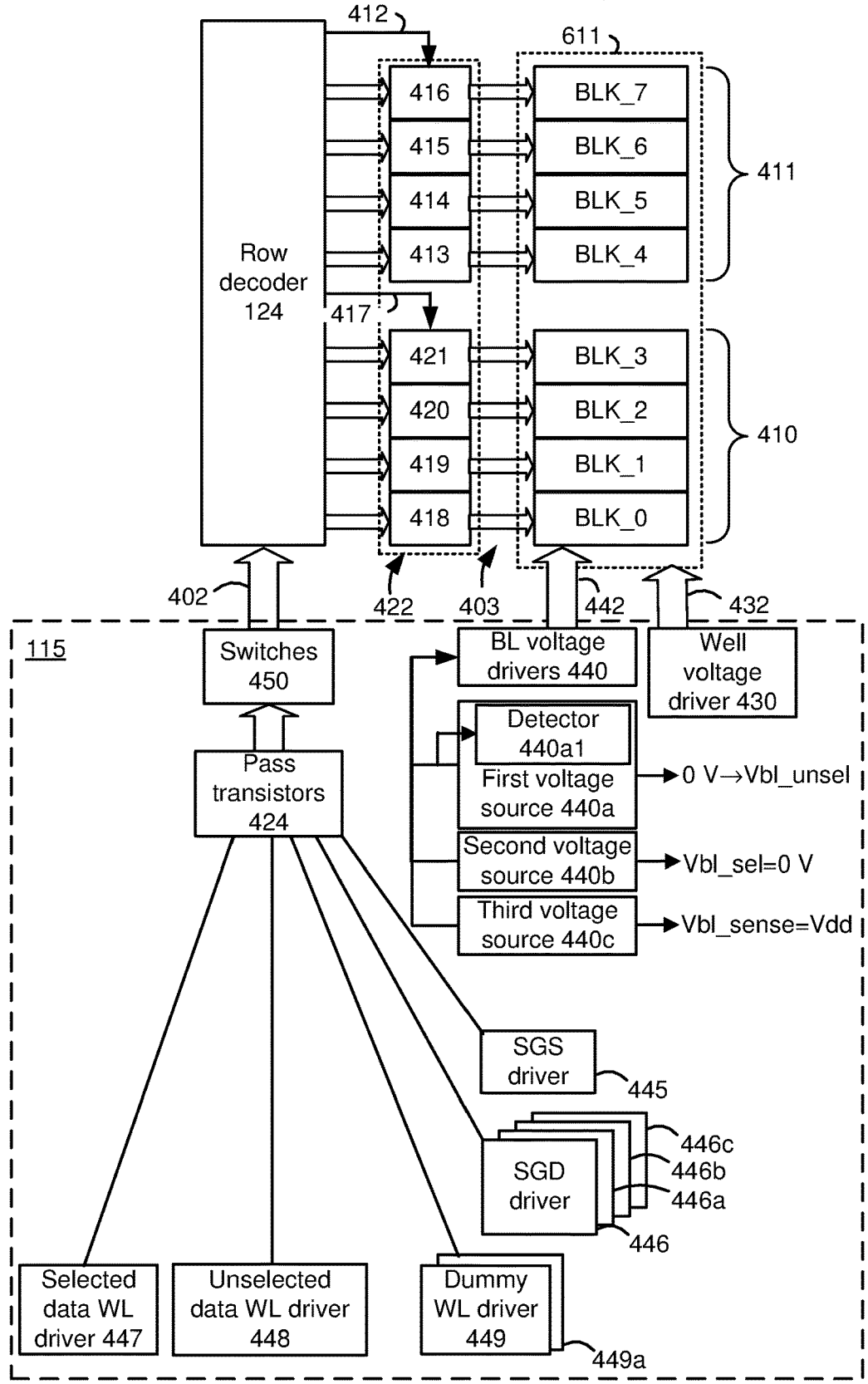
FIG. 3A depicts an example implementation of the power control circuit 115 of FIG. 1 for providing voltages to blocks of memory cells.

FIG. 3A depicts an example implementation of the power control circuit 115 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected sub-block at a time in a block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The driver 447 can provide a pre-charge voltage and a program voltage on WLn during a program loop of a program operation. A driver 448 can be used for unselected data word lines, and dummy word line drivers 449 and 449a can be used to provide voltages on dummy word lines WLDD and WLDS, respectively, in FIG. 6A. For example, the driver 448 can be used to apply a pre-charge voltage and a pass voltage on the unselected word lines during a program loop of a program operation. See also VWL_unsel in FIG. 10.

The voltage drivers can also include separate SGD drivers for each sub-block. For example, SGD drivers 446, 446a, 446b and 446c can be provided for SB0, SB1, SB2 and SB3, respectively, such as in FIG. 7A. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a voltage Vsl to the well region 611b (FIG. 6A) in the substrate, via control lines 432. The well voltage driver 430 is one example of a source line driver, where the well region 611b is a source line, e.g., a conductive path connected to the source ends of the NAND strings. In one approach, the well region 611a is common to the blocks. A set of bit lines 442 is also shared by the blocks.

Bit line voltage drivers 440 include voltage sources which provide voltages to the bit lines. For example, the bit line voltage drivers can include a first voltage source 440a which is configured to output a program-inhibit voltage signal. This signal increases from an initial level such as 0 V to a final, peak level such as Vbl_unsel, to pre-charge a channel of a respective NAND string and prevent programming of memory cells in the NAND string. As mentioned at the outset, various characteristics of the program-inhibit voltage signal can be adjusted as described herein based on factors such as the position of a current program loop in a plurality of program loops of a program operation and a program progress. These characteristics can include the start time, ramp rate and/or transition voltage. When the program-inhibit voltage signal is below the transition voltage, it may be increased at a regulated ramp rate. When the program-inhibit voltage signal is above the transition voltage, it may be increased at an unregulated ramp rate. See FIG. 13A-13C.

The first voltage source 440a includes a detector 440a1 which detects when the output voltage reaches a specified percentage or portion of the final voltage, Vbl_unsel, such as 75% or 90%, as discussed in connection with FIG. 13A-13C.

The bit line voltage drivers can also include a second voltage source 440b which is configured to output a program-enable voltage signal. This signal can have a fixed voltage such as 0 V which allows programming to occur for a selected memory cell in a respective NAND string. The bit line voltage drivers can also include a third voltage source 440c which is configured to output a fixed voltage, Vbl_sense, which allows sensing to occur for a selected memory cell in the respective NAND string. The sensing can occur during a read or a verify test. The voltage sources 440a, 440b and 440c may be connected to the sense circuits and used to provide voltages to the Vbl selector 173 of FIG. 2, for example.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 3B:
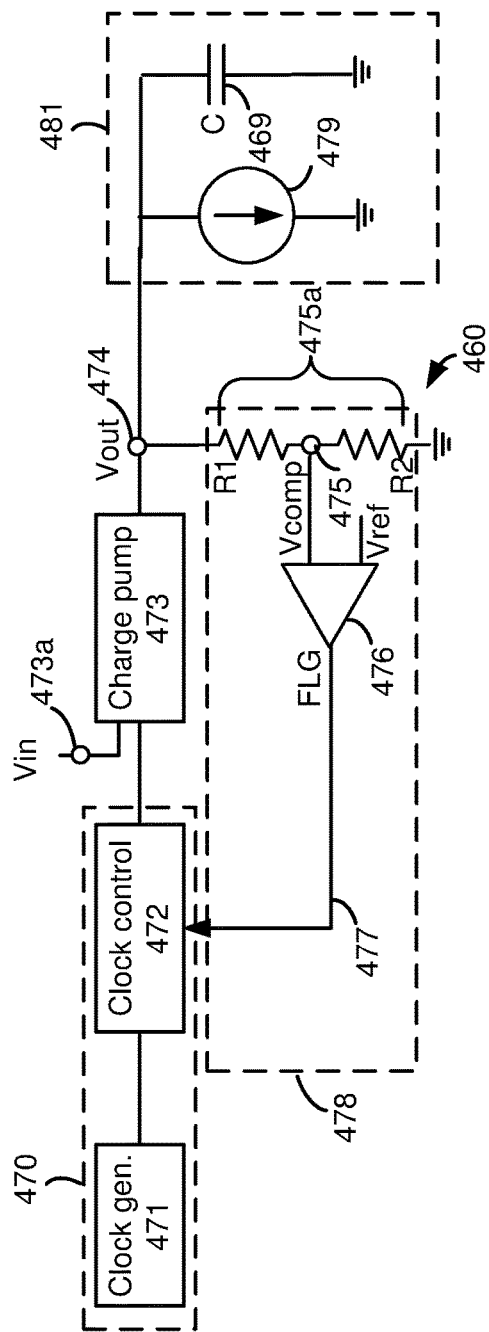
FIG. 3B depicts a charge pump circuit 460 as an example implementation of the first voltage source 440*a* of FIG. 3A.

FIG. 3B depicts a charge pump circuit 460 as an example implementation of the first voltage source 440a of FIG. 3A. A similar charge pump circuit could be provided for the voltage sources 440b and 440c of FIG. 3A. The charge pump circuit is connected to a load 481. The load may include a current sink 479, as an example of a DC load, and/or a capacitor 469, as an example of an AC load. The load can represent a component in a circuit, such as a bit line, which operates using a specified input voltage.

The charge pump circuit includes a clock source 470 which provides a clock signal constantly or alternatingly to a charge pump 473. The clock source, which is a circuit, includes a clock generator 471 which outputs a clock signal at a specified frequency to a clock control circuit 472. The clock control circuit 472 either blocks the signal from reaching the charge pump, or passes the clock signal to the charge pump. The clock control circuit therefore provides a gating function. The clock signal is responsive to a feedback circuit 478 which includes a feedback path 477, a comparator 476 and a voltage divider 475a. The voltage divider 475a divides the output voltage Vout using resistors R1 and R2 to provide a comparison voltage Vcomp at an output node 475. Vcomp is compared to a reference voltage Vref at the comparator to set a flag FLG. FLG=0 if Vcomp>Vref and FLG=1 if Vcomp<=Vref. Note that Vcomp is a known fraction (R2/(R1+R2)) of Vout, so that a comparison of Vcomp to Vref by the comparator is equivalent to a comparison of Vout to a specified output voltage, Vout_spec.

When FLG=1, the clock control circuit passes the clock signal to the charge pump to operate the charge pump in a pumping mode, where charge is transferred from an input node 473a at an input voltage Vin to the output node. When FLG=0, the clock control circuit does not pass the clock signal to the charge pump, so that the charge pump operates in a non-pumping mode, where charge is not transferred from the input node to the output node 474. Vout will tend to decay in the non-pumping mode as the load is driven.

Figure 3C:
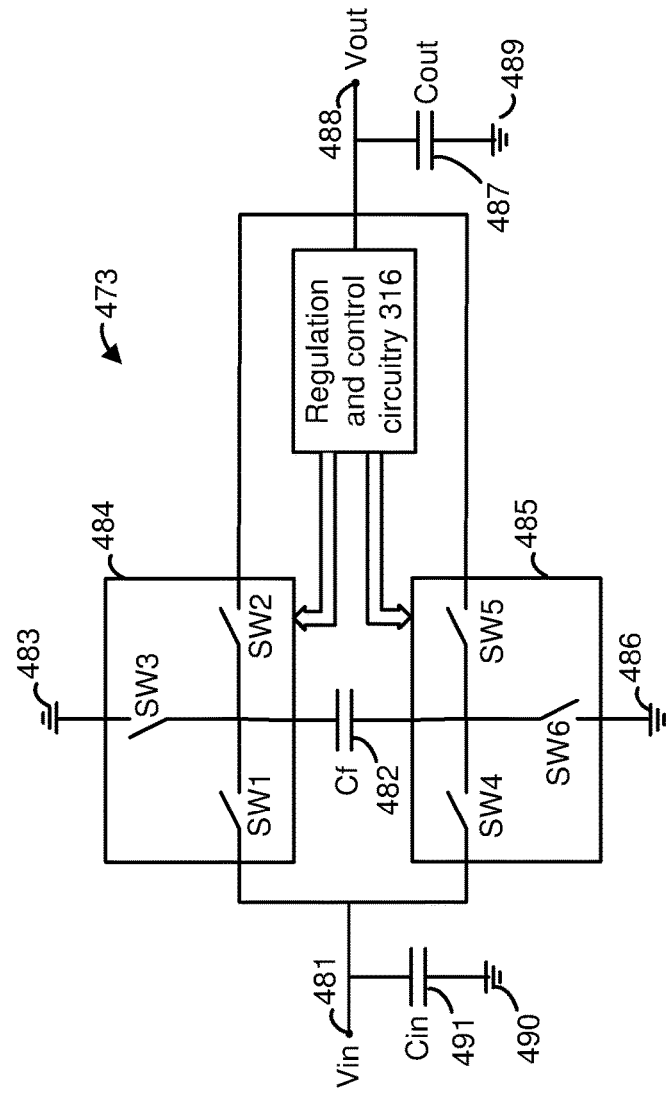
FIG. 3C depicts an example implementation of the charge pump 473 of FIG. 3B.

FIG. 3C depicts an example implementation of the charge pump 473 of FIG. 3B. A single-stage charge pump is depicted. A charge pump generally refers to a switching voltage converter that employs an intermediate capacitive storage element which is sometimes referred to as a flying capacitor or a charge transfer capacitor. One or more flying capacitors can be used. Moreover, a charge pump can include multiple stages connected in series to obtain special features such as a high output voltage and a greater range of output voltages. A charge pump can be constructed or configured for providing voltage conversion for applications including: multiplier, divider, inverter and follower. The principles discussed herein can be applied to one or more stages, and to one or more capacitors in a stage. The charge pump 473 is a generalized embodiment which can be controlled for multiplier, divider, inverter and follower applications. The charge pump 473 includes an input node 473a at which a voltage Vin is applied. For example, Vin may be a fixed power supply voltage sometimes referred to as Vdd in a semiconductor chip. Charge from the voltage is maintained in an input capacitor CM 491 which is connected to a ground node 490.

A first set of switches 484 and a second set of switches 485 are controlled by regulation and control circuitry 316 to transfer charge from the input node 473a to a flying capacitor Cf 482, and from Cf 482 to an output node 488. Vout is a resulting voltage at the output node 488, and can be greater than or less than Vin. The output node is coupled to an output capacitor Cout 487, which is connected to a ground node 489. The first set of switches 484 includes switches SW1, SW2 and SW3 which are star-connected to one terminal (such as the top conductor) of Cf. The switches may be MOSFETs, bipolar junction transistors, relay switches, or the like. SW1 connects the top conductor of Cf to the input node 473a to receive a charge from Vin. SW2 connects the top conductor of Cf to the output node 488 to transfer its charge to the output node. SW3 connects the top conductor of Cf to a ground node 483. Similarly, the second set of switches 485 includes switches SW4, SW5 and SW6 which are star-connected to another terminal (such as the bottom conductor) of Cf. SW4 connects the bottom conductor of Cf to the input node 473a to receive a charge from Vin. SW5 connects the bottom conductor of Cf to the output node 488 to transfer its charge to the output node. SW6 connects the bottom conductor of Cf to a ground node 486.

Generally, the charge pump operation includes two main phases: charging Cf from the input node, and discharging Cf into the output node. During each phase, one of the switches in each set of switches is closed, connecting Cf to either the input node, the output node, or a ground node. Further, the regulation and control circuitry 316 provides the switches with appropriate control signals, including frequency, phases, amplitudes, delays, etc., depending on the particular application. The regulation and control circuitry 316 may communicate with the output node 488 as well such as to detect its level. Note that the circuits shown are examples only, as various modifications can be made.

Figure 4:
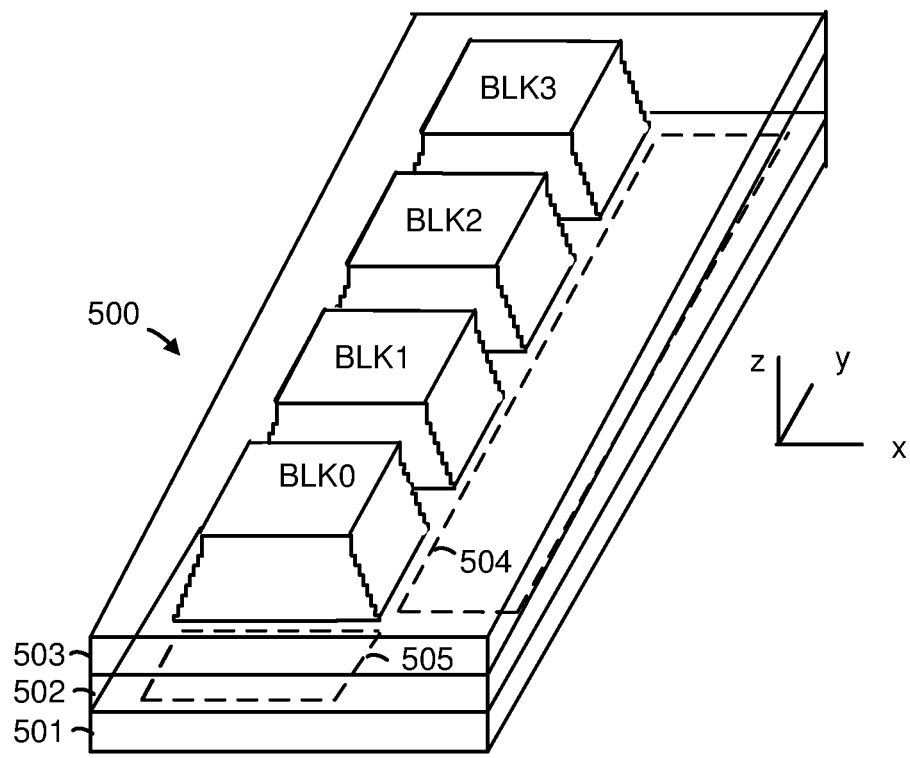
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
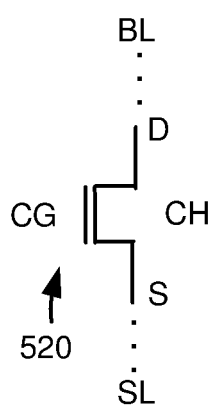
FIG. 5 depicts an example transistor 520 in the memory structure 126 of FIG. 1.

FIG. 5 depicts an example transistor 520 in the memory structure 126 of FIG. 1. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string.

Figure 6A:
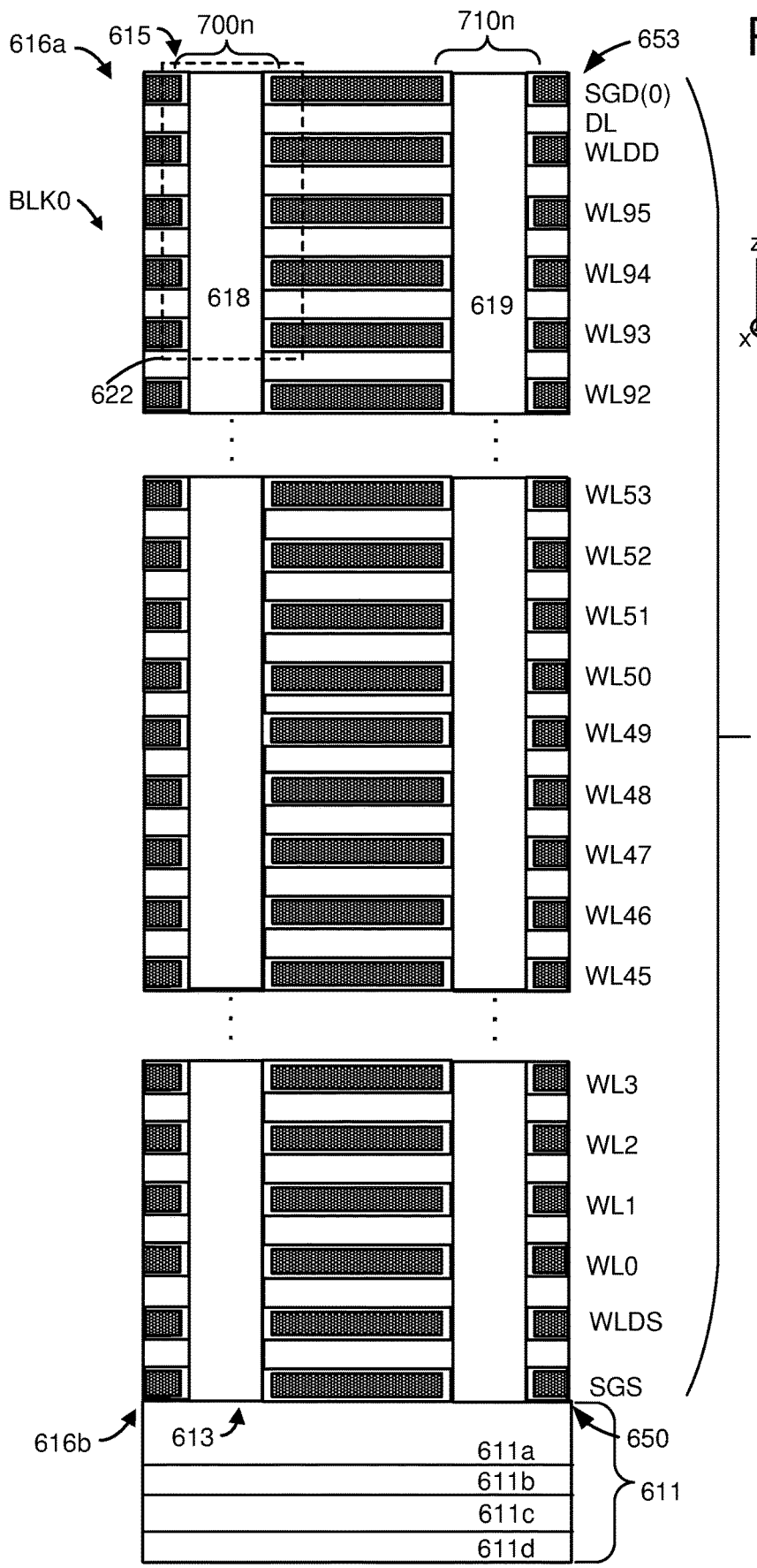
FIG. 6A depicts an example cross-sectional view of a portion of BLK0 of FIG. 4, including NAND strings 700*n* and 710*n*.

FIG. 6A depicts an example cross-sectional view of a portion of BLK0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611a (see also FIG. 3) is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string in a block.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
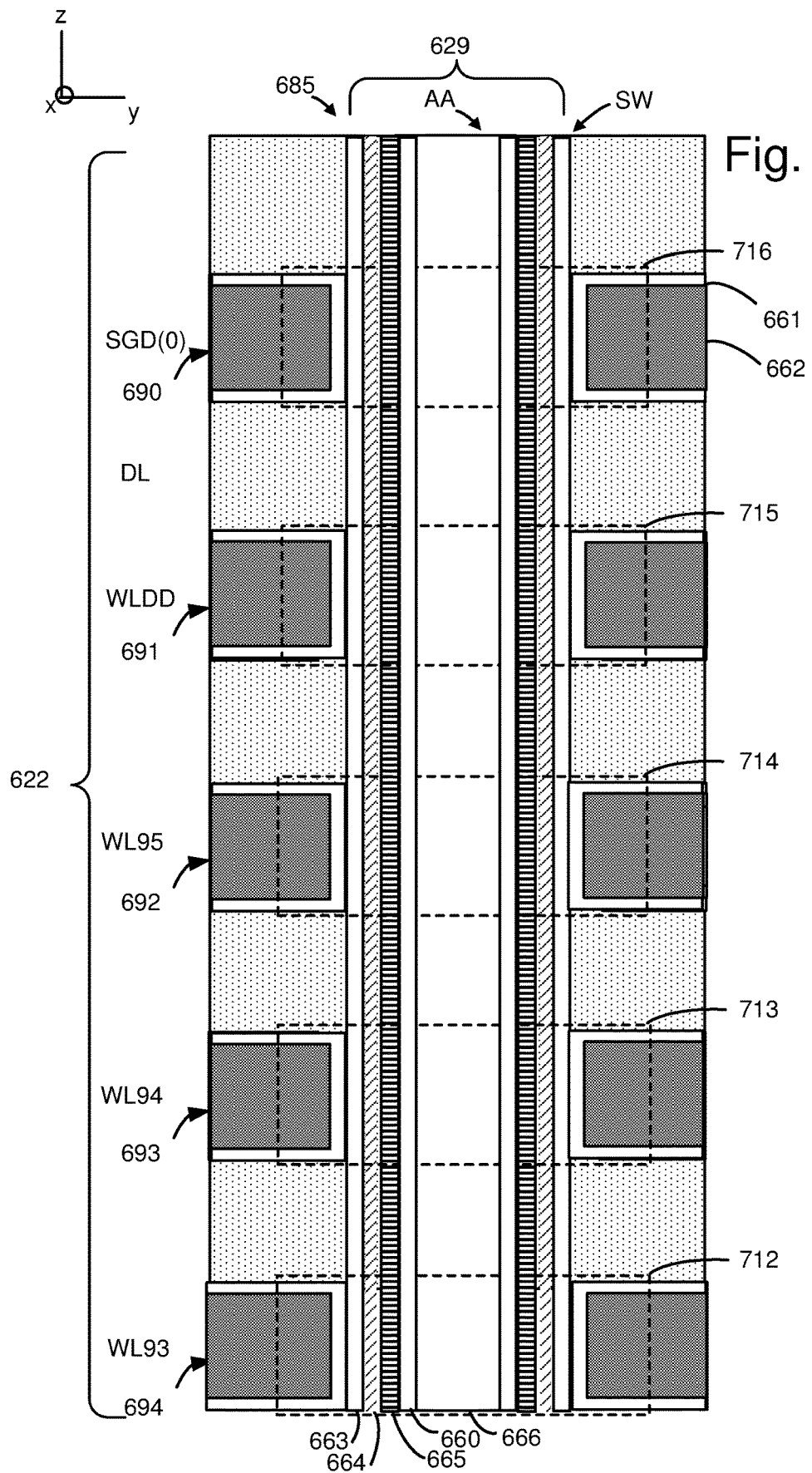
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride ($Si_3N_4$) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

FIG. 7A depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 7B:
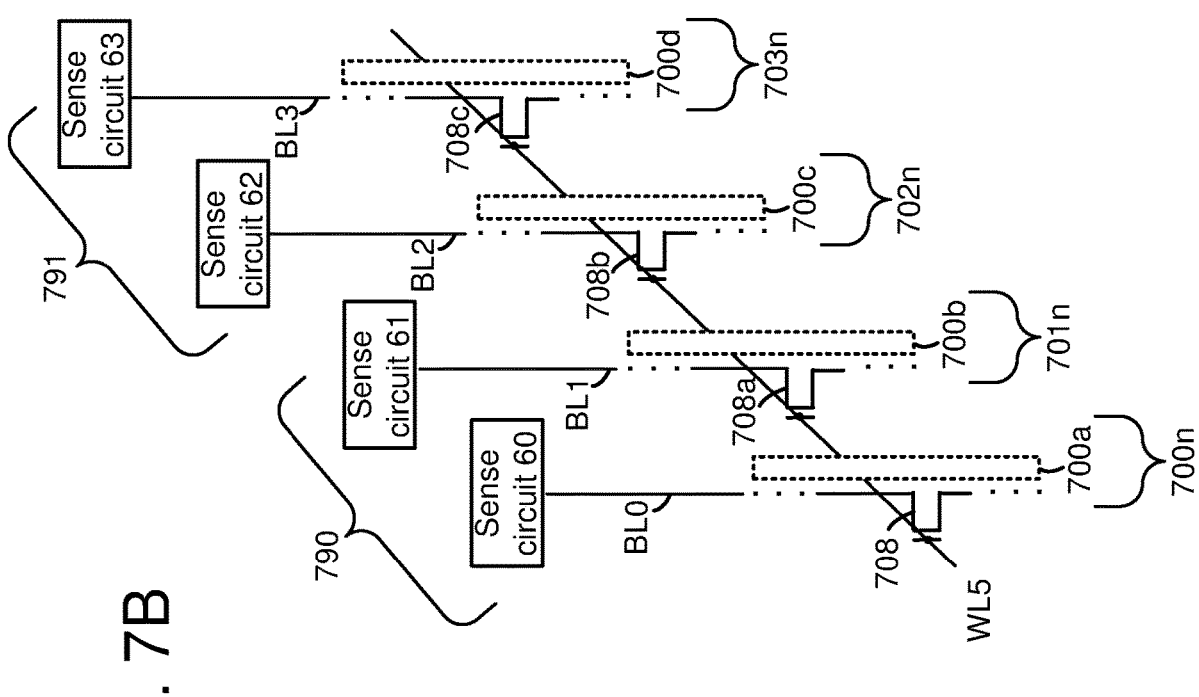
FIG. 7B depicts an example view of memory cells connected to WL5 in the sub-block SB0 of FIG. 7A, with respective NAND strings, bit lines and sense circuits.

FIG. 7B depicts an example view of memory cells connected to WL5 in the sub-block SB0 of FIG. 7A, with respective NAND strings, bit lines and sense circuits. The memory cell 708 and channel 700a of the NAND string 700n in SB0 of FIG. 7A are depicted, along with a respective bit line BL0. SB0 also includes memory cells 708a, 708b and 708c in NAND strings 701n, 702n and 703n, respectively, which have channels 700b, 700c and 700d, respectively, and which are connected to bit lines BL1, BL2 and BL3, respectively. The bit lines BL0-BL3 are connected to the sense circuits 60-63, respectively, of FIG. 2.

In a program loop, the memory cells 708 and 709 could be examples of selected and unselected memory cells, respectively, in which case the NAND strings 700n and 701n are examples of selected and unselected NAND strings, respectively, and the bit lines BL0 and BL1 are examples of selected and unselected bit lines, respectively.

The sense circuits 60 and 61 could be an example of one subset of sense circuits 790 and the sense circuits 62 and 63 could be an example of another subset of sense circuits 791 such as discussed in connection with FIG. 13A-13C.

Figure 8:
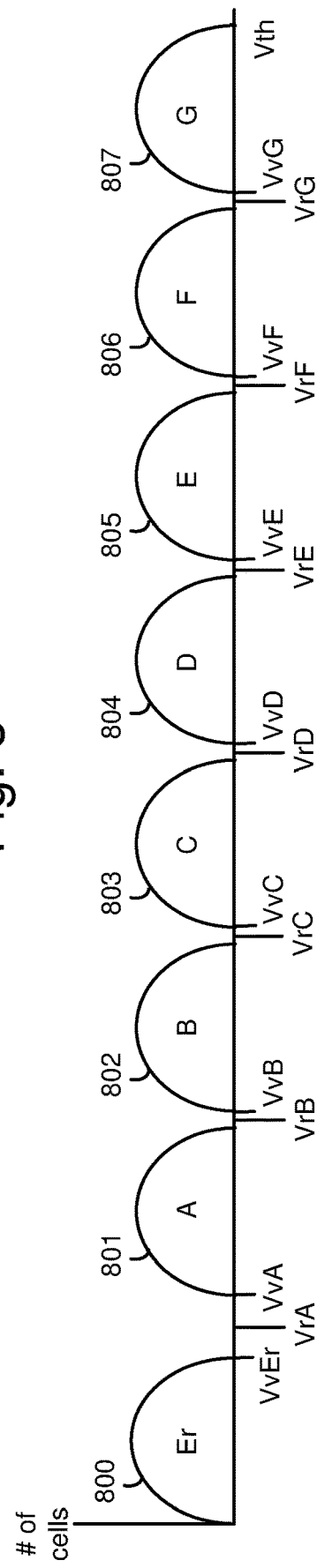
FIG. 8 depicts example Vth distributions of a set of memory cells with three bits per cell and eight data states.

FIG. 8 depicts example Vth distributions of a set of memory cells with three bits per cell and eight data states. The vertical axis depicts a number of memory cells on a logarithmic scale, and the horizontal axis depicts a Vth of the memory cells on a linear scale.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states. In a four-bit per cell memory device, there are sixteen data states including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

In one approach, at a start of a program operation, the memory cells are all initially in the erased (Er) state, as represented by the Vth distribution 800. After the program operation is successfully completed, the memory cells assigned to the A-G states are represented by the Vth distributions 801-807.

The memory cells which are programmed to the A-G states using verify voltages (Vverify) of VvA-VvG, respectively, are represented by the Vth distributions 801-807, respectively. These Vth distributions are obtained just after completion of the program operation, and assume no program disturb or neighbor word line interference has occurred. The verify voltages are used in the program-verify tests of the memory cells. Read voltages VrA-VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight-state example.

Figure 9B:
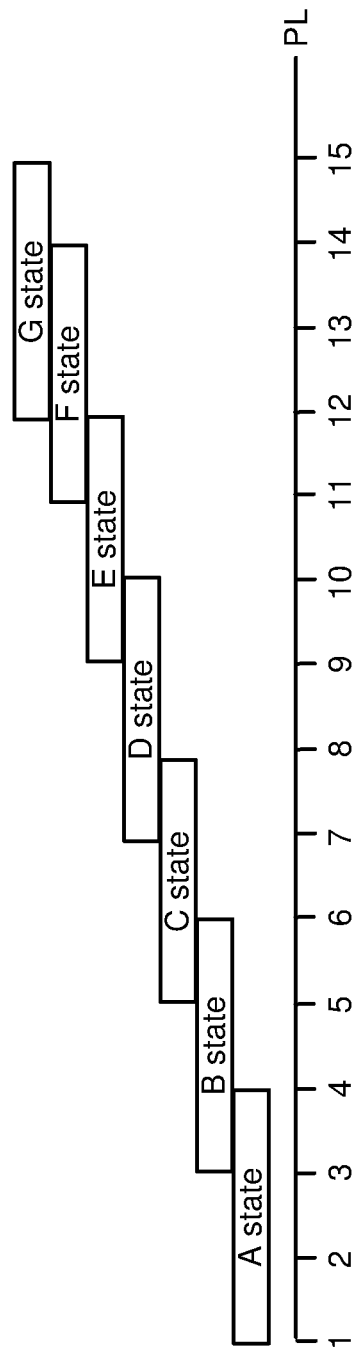
FIG. 9B depicts an example of verify voltages used in the different program loops of FIG. 9A.

FIG. 9A depicts an example voltage signal used in a program operation, consistent with FIG. 8. The voltage signal 900 includes a set of program pulses, including an initial program pulse 901, which are applied to a word line selected for programming. The initial program pulse has a voltage Vpgm_init, and dVpgm denotes the step size between successive program pulses. A single program pass is used having 15 program loops, as an example. The verify signals in each program loop, including example verify signals 902, can encompass lower assigned data states, then midrange assigned data states and then higher assigned data states as the program operations proceeds, as depicted in FIG. 9B.

The example verify signals depict three verify voltages as a simplification. A verify signal is applied to a selected word line during a program loop after the application of a program pulse to the selected word line. Memory cells are sensed during the application of the verify signal in a verify test to judge their programming progress. A verify signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. The data of the lower and upper pages can be determined by reading the memory cells using read voltages of VrA and VrC; and VrB, respectively.

With three bits per cell, three pages of data can be stored in the memory cells connected to a word line. The data of the lower, middle and upper pages can be determined by reading the memory cells using read voltages of VrA and VrE; VrB; and VrC and VrG, respectively.

The program loops (PLs) can be classified into three sets, e.g., an initial set of PLs 910, an intermediate set of PLs 911 and a final set of PLs 912 which include PL=1-3, PL=4-9 and PL=10-15, respectively, as an example which is consistent with FIG. 12A. Each set can include one or more successive PLs. The initial set of PLs includes the first PL of the program operation (PL=1). The final set of PLs includes the last PL of the program operation (PL=15). The intermediate set of PLs is between the initial and final sets of PLs. Generally, the program loops (PLs) can be classified into two or more sets, where the characteristics of the program-inhibit voltage signal are adjusted for each set to optimize program time and current consumption.

The example sets of FIG. 9A can be predetermined based on program loop numbers, in one approach, e.g., PL=1-3, PL=4-9 and PL=10-15. In another approach, the sets are determined adaptively as the programming progresses. For example, the start of the intermediate and final sets of program loops can when the program operation reaches predetermined milestones. For example, a program loop in which a verify test begins or end for a specified data state can signal the start of a new set of PLs. In one example, the start of the B state verify test signals the start of the intermediate set of PLs, and the start of the G state verify test signals the start of the final set of PLs.

FIG. 9B depicts an example of verify voltages used in the different program loops of FIG. 9A. The horizontal bars are time-aligned with the program loop axis of FIG. 9A. The bars overlap in some program loops, indicating that verify operations can be performed for multiple data states in the program loop. With eight data states, the bars indicate that verify voltages for the A, B, C, D, E, F and G states are applied in program loops 1-4, 3-6, 5-8, 7-10, 9-12, 11-14 and 12-15, respectively.

In one approach, the program loops in which the verify tests are performed are predetermined, before the program operation. In another approach, the program loops in which the verify tests are performed are determined adaptively as the programming progresses. For example, the B state verify tests may begin in a next program loop after a specified portion of the A state memory cells have passed their verify test.

FIG. 10 depicts example voltage signals for performing a program operation, consistent with FIG. 9A. The vertical dimension denotes voltage and the horizontal dimension denotes time, with time points t0-t12. The period of time depicted corresponds to one program loop and includes a pre-charge phase 1007 (t0-t2), a program phase 1008 (t2-t8) and a verify phase 1009 (t9-t12). Voltage signals 1000, 1010, 1030, 1040 and 1050 depict VWLn, VWL_unsel, Vsg, Vbl and Vsl, respectively.

In the pre-charge phase, VWLn and VWL_unsel can be set to a pre-charge voltage, e.g., 1-2 V.

For the bits lines of the unselected NAND strings, a program-inhibit voltage signal (plot 1041) is ramped up from 0 V to 2 V, for instance, at t0 to provide a small amount of channel boosting in the pre-charge phase and to prevent programming in the program phase. The program-inhibit voltage signal includes a ramped up portion 1041a and a fixed portion 1041b. Various options for implementing the ramped up portion 1041a are discussed in connection with FIG. 13A-13C. For the bit lines of the selected NAND string, a fixed voltage such as 0 V (plot 1032) is applied to avoid channel boosting in the pre-charge phase and to allow programming to occur in the program phase. The program-enable voltage signal at 0 V is depicted by the plot 1042.

The SGD transistors of the selected and unselected sub-blocks are in a conductive state at this time, with a voltage of Vsg=6 V, for example. This allows the bit line voltage to be passed to the channel. The SGS transistors of the selected and unselected sub-blocks can also be in a conductive state at this time, with a voltage of 6 V, for example to allow Vsl=1 V to be passed to the source end of the channel.

Vsgd is set to 6 V to pass the bit line voltage to the drain ends of the NAND strings. In the program phase, VWLn and Vwl_unsel are ramped up, e.g., starting at t3, to provide a capacitive coupling up of the channels of the inhibited NAND strings. VWLn is then ramped up further at t5 to the peak program pulse level of Vpgm (plot 1001) and held at Vpgm until t4. After the application of the program pulse, the word line voltages are ramped down in a recovery process. During the program pulse, Vsgd for the selected sub-block, Vsgd_sel (plot 1031), is high enough to provide the selected SGD transistors in a conductive state for the selected NAND strings, which receive Vbl_sel=0 V, but low enough to provide the selected SGD transistors in a non-conductive state for the inhibited NAND strings, which receive Vbl_unsel=2 V. Vsgd for the unselected sub-blocks, Vsgd_unsel (plot 1032) can be set to 0 V to provide the corresponding SGD transistors in a non-conductive state.

Subsequently, in the verify phase, one or more verify tests are performed by applying a verify signal (plot 1002) with one or more verify voltages on WLn and, for each verify voltage, sensing the conductive state of the memory cells in the selected NAND strings of the selected sub-block. The SGD and SGS transistors are in a strongly conductive state to allow sensing to occur for the selected memory cells. During the verify tests, Vbl_sense=0.5 V is applied to the bit lines.

The voltages depicted are examples.

FIG. 11A depicts capacitances in a set of bit lines BL0-BL15 due to the ramped up portion 1041a of the program-inhibit voltage signal 1041 of FIG. 10, consistent with the initial set of program loops 910 of FIG. 9A.

FIG. 11A-11C depict a common set of bit lines BL0-BL15 and memory cells 1100-1115. Each memory cell has an assigned data state, e.g., Er-G, as indicated. The memory cells 1100-1115 are connected to BL0-BL15, respectively, and assigned to the A, D, B, F, B, C, F, D, Er, A, E, C, G, E, G and Er data states, respectively. A capacitor symbol denotes the presence of a capacitance between adjacent selected and unselected bit lines. The notation "Pgm" or "Inh" indicates the respective memory cell is programmed (selected) or inhibited (unselected), respectively.

As mentioned at the outset, during the increasing of the program-inhibit voltage signal for an inhibited NAND string, a capacitance is created when a fixed voltage is applied to the bit line of an adjacent selected NAND string. The capacitance increases the amount of current used to increase the program-inhibit voltage signal. Moreover, the likelihood of an inhibited NAND string being adjacent to a selected NAND string in a program loop is a function of the position of the program loop in the program operation, e.g., a function of the programming progress. In an initial set of program loops of the program operation, there is a relatively large number of selected NAND strings compared to the number of unselected NAND strings. In an intermediate set of program loops of the program operation, there is a roughly similar number of selected and unselected NAND strings. In a final set of program loops of the program operation, there is a relatively large number of unselected NAND strings compared to the number of selected NAND strings.

Therefore, the likelihood of an inhibited NAND string being adjacent to a selected NAND string is relatively small in the initial and final set of program loops, and relatively large in the intermediate set of program loops. As a result, the total capacitance between bit lines, and the current required to increase the program-inhibit voltage signal, is relatively small in the initial and final set of program loops, and relatively large in the intermediate set of program loops. The characteristics of the program-inhibit voltage signal can therefore be adjusted to use less current when the total capacitance between bit lines is relatively large, and to use more current when the total capacitance between bit lines is relatively small. See FIG. 13A-13C for examples of different characteristics of the program-inhibit voltage signal.

FIG. 11A represents the case of the first program loop, PL=1, in FIG. 9A. In this case, the program-inhibit voltage signal is only applied to the bit lines of memory cells assigned to the erased state, e.g., memory cells 1108 and 1115, and the program-enable voltage signal is applied to the bit lines of the remaining memory cells, which are assigned to programmed data state. During the increase of the program-inhibit voltage signal, a capacitance C is created between BL7-BL8, BL8-BL9 and BL14-BL15. The total capacitance is 3×C, where C is the capacitance between two adjacent bit lines.

FIG. 11B depicts capacitances in a set of bit lines BL0-BL15 due to the ramped up portion 1041a of the program-inhibit voltage signal 1041 of FIG. 10, consistent with the intermediate set of program loops 911 of FIG. 9A. The example corresponds to PL=12 in FIG. 9A. The memory cells assigned to the Er-D states, e.g., memory cells 1100-1102, 1104, 1105, 1107-1109, 1111 and 1115, have completed programming, so that the program-inhibit voltage signal is applied to their bit lines, e.g., bit lines BL0-BL2, BL4, BL5, BL7-BL9, BL11 and BL15, respectively. The memory cells assigned to the E-G states, e.g., memory cells 1103, 1106, 1110 and 1112-1114 have not completed programming, so that the program-enable voltage signal is applied to their bit lines e.g., bit lines BL3, BL6, BL10 and BL12-BL14, respectively. During the increase of the program-inhibit voltage signal, a capacitance C is created between BL2-BL3, BL3-BL4, BL5-BL6, BL6-BL7, BL9-BL10, BL10-BL11, BL11-BL12 and BL14-BL15. The total capacitance is 8×C.

FIG. 11C depicts capacitances in a set of bit lines BL0-BL15 due to the ramped up portion 1041a of the program-inhibit voltage signal 1041 of FIG. 10, consistent with the final set of program loops 912 of FIG. 9A. The example corresponds to PL=15 in FIG. 9A. The memory cells assigned to the Er-F states, e.g., memory cells 1100-1111, 1113 and 1115, have completed programming, so that the program-inhibit voltage signal is applied to their bit lines, e.g., bit lines BL0-BL11, BL13 and BL15, respectively. The memory cells assigned to the G state, e.g., memory cells 1112 and 1114 have not completed programming, so that the program-enable voltage signal is applied to their respective bit lines e.g., bit lines BL12 and BL14, respectively. During the increase of the program-inhibit voltage signal, a capacitance C is created between BL11-BL12, BL12-BL13 and BL14-BL15. The total capacitance is 3×C.

FIG. 11A-11C show that the total capacitance of the bit lines is relatively high for the intermediate set of program loops, e.g., 8×C, and relatively low for the initial and final sets of program loops, e.g., 3×C. Therefore, the current consumption of the voltage source 440a for the program-inhibit voltage signal will be relatively high for the intermediate set of program loops, and relatively low for the initial and final sets of program loops. See FIG. 12A. This represents an opportunity to increase performance by adjusting the characteristics of the program-inhibit voltage signal during the initial and final sets of program loops to use additional current. For example, the start of the ramp up can be earlier, the ramp up rate can be greater and/or the transition voltage can be lower in the initial and final sets of program loops compared to the intermediate set of program loops. The maximum allowed current consumption in each program loop can be a fixed level which is typically defined by the manufacturer for the memory device.

On the other hand, if the peak current exceeds the maximum allowed current during the intermediate set of program loops, a corrective action can be taken such as reducing the ramp up rate or increasing the transition voltage. These corrective actions can prevent voltage droop and malfunction of the memory device.

The techniques provided herein are applicable to current and emerging memory devices include non-volatile memory devices. The techniques are applicable when the memory cells store multiple data states and there is a varying capacitance between bit lines or other control lines over multiple program loops or cycles of a program operation.

FIG. 12A depicts a plot of current consumption versus time during a program operation, where the program loops are classified into three sets based on current consumption, consistent with FIG. 9A. The current consumption is based on the voltage signals applied to various control lines such as word lines, select gate lines and bit lines, as well as current consumed by components such as sense circuits. The peak current consumption is Icc_peak_1, Icc_peak_2 and Icc_peak_3 during the initial, intermediate and final sets of program loops, respectively. Icc_peak_2>Icc_peak_1 and Icc_peak_2>Icc_peak_3. Also, Icc_peak_1 is about the same as or slightly less than Icc_peak_3.

The peak current consumption is relatively low in the initial and final sets of program loops compared to the intermediate set of program loops. This example divides the program loops into three sets based on current consumption. It is possible to divide the program loops into fewer sets, e.g., two sets, or more sets, e.g., four of more sets. See FIG. 12B.

The plot of current consumption is obtained without adjusting the characteristics of the program-inhibit voltage signal.

As mentioned, the characteristics of the program-inhibit voltage signal can be optimized for each set of program loops. In one approach, the characteristics are the same for the initial and final sets, to provide a simpler implementation. In another approach, the characteristics are different for each set, to provide the greatest flexibility and optimization.

Figure 12B:
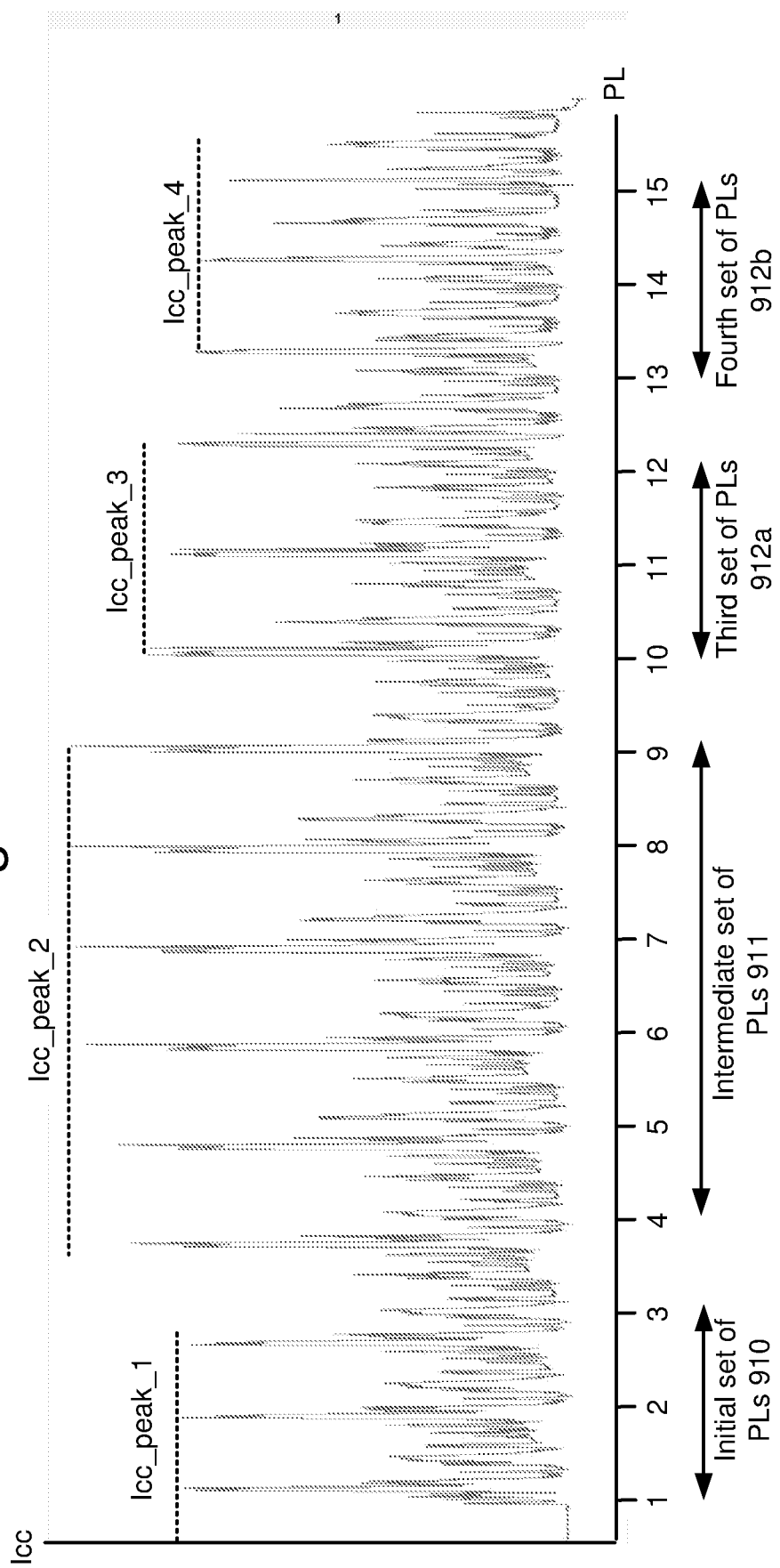
FIG. 12B depicts a plot of current consumption versus time during a program operation, where the program loops are classified in four sets based on current consumption.

FIG. 12B depicts a plot of current consumption versus time during a program operation, where the program loops are classified in four sets based on current consumption. The peak current consumption is Icc_peak_1 and Icc_peak_2 during the initial (first) and intermediate (second) sets of program loops, respectively, as in FIG. 12A. The peak current consumption is Icc_peak_3 and Icc_peak_4 during third (next to final) and fourth (final) sets of program loops 912a and 912b, respectively. Icc_peak_3>Icc_peak_4 and Icc_peak_1>Icc_peak_4.

Figure 13A:
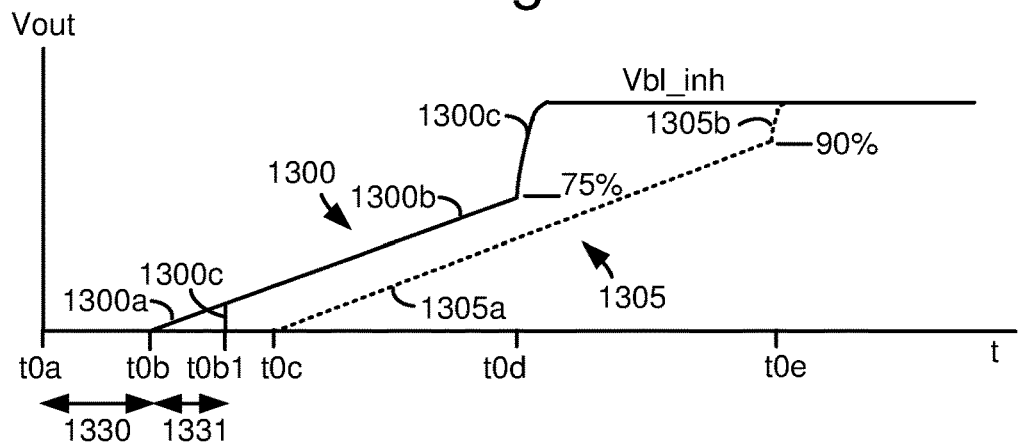
FIG. 13A depicts a plot 1300 of a first program-inhibit voltage signal with a relatively early ramp up start time and a relatively low transition voltage to reduce program time, and a plot 1305 of a second program-inhibit voltage signal with a relatively late ramp up start time and a relatively high transition voltage to reduce current consumption.
Figure 13B:
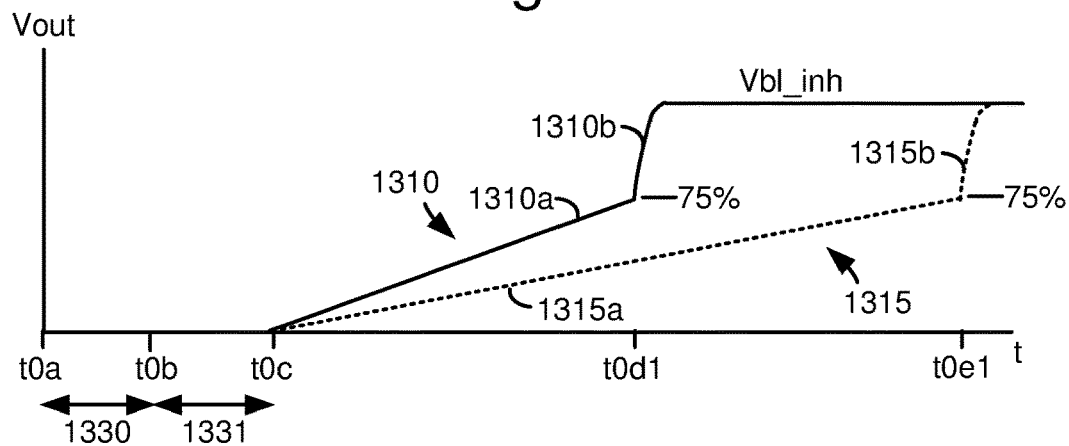
FIG. 13B depicts a plot 1310 of a first program-inhibit voltage signal with a relatively high ramp up rate to reduce program time and a plot 1315 of a second program-inhibit voltage signal with a relatively low ramp up rate to reduce current consumption, where both signals have the same start time and transition voltage.
Figure 13C:
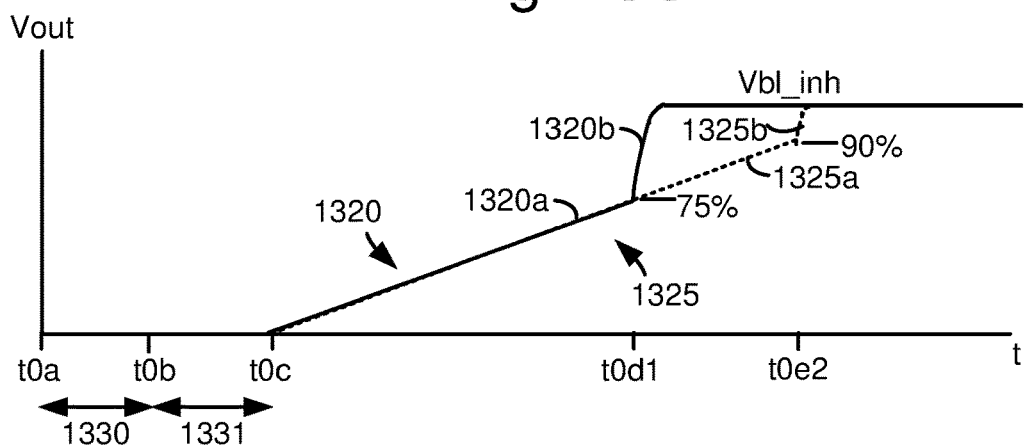
FIG. 13C depicts a plot 1320 first program-inhibit voltage signal with a relatively low transition voltage to reduce program time and a plot 1325 of a second program-inhibit voltage signal with a relatively high transition voltage to reduce current consumption, where both signals have the same start time and ramp up rate.

FIG. 13A-13C show examples of program-inhibit voltage signals with different characteristics. Each figure has a common vertical axis which represents voltage and a common horizontal axis which represents time. The portion of the signals shown corresponds to the ramped up portion 1041a of the program-inhibit voltage signal 1041 of FIG. 10. Also, the time points t0a, t0b and t0c represent options for the time point t0 in FIG. 10. The plots provide options for optimizing the characteristics of the program-inhibit voltage signal to optimize current consumption and performance in a program operation. The characteristics can include the start time for ramping up the program-inhibit voltage signal, a ramp up rate and a transition voltage.

Figure 15B:
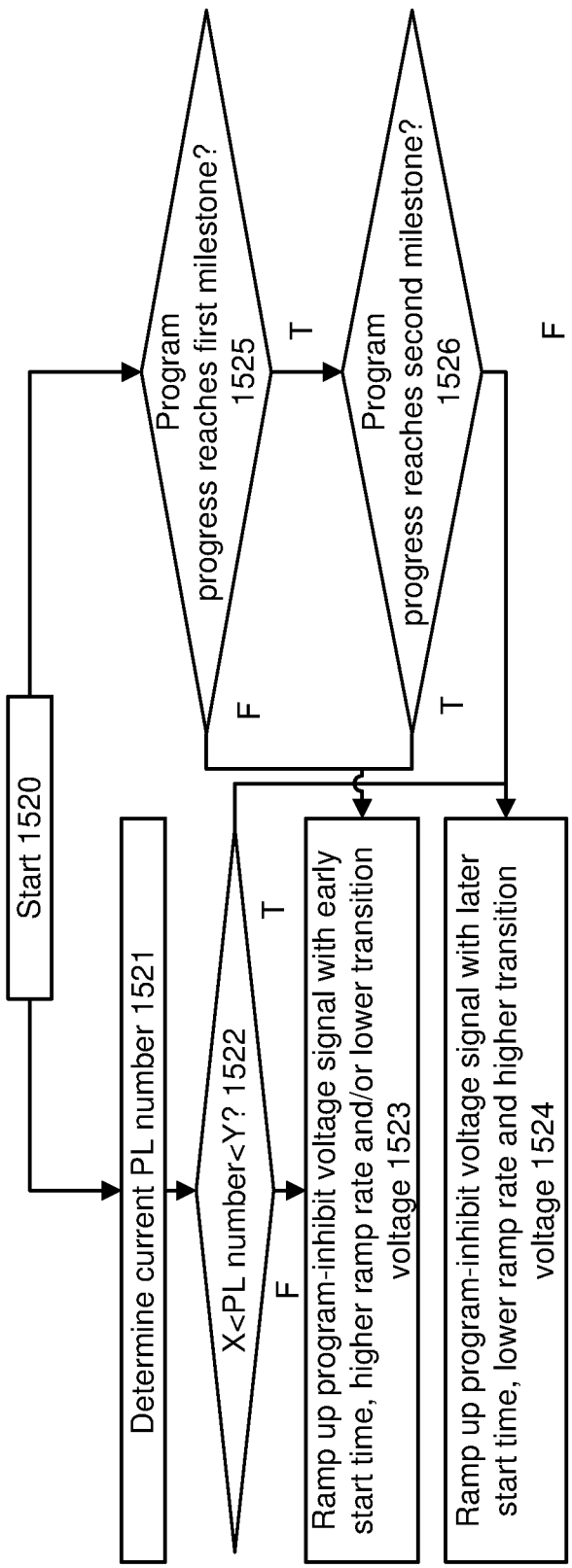
FIG. 15B depicts a process for implementing step 1501 of FIG. 15A to determine characteristics of a program-inhibit voltage signal based on a position of the program loop and/or a program progress of the program operation.
Figure 15C:
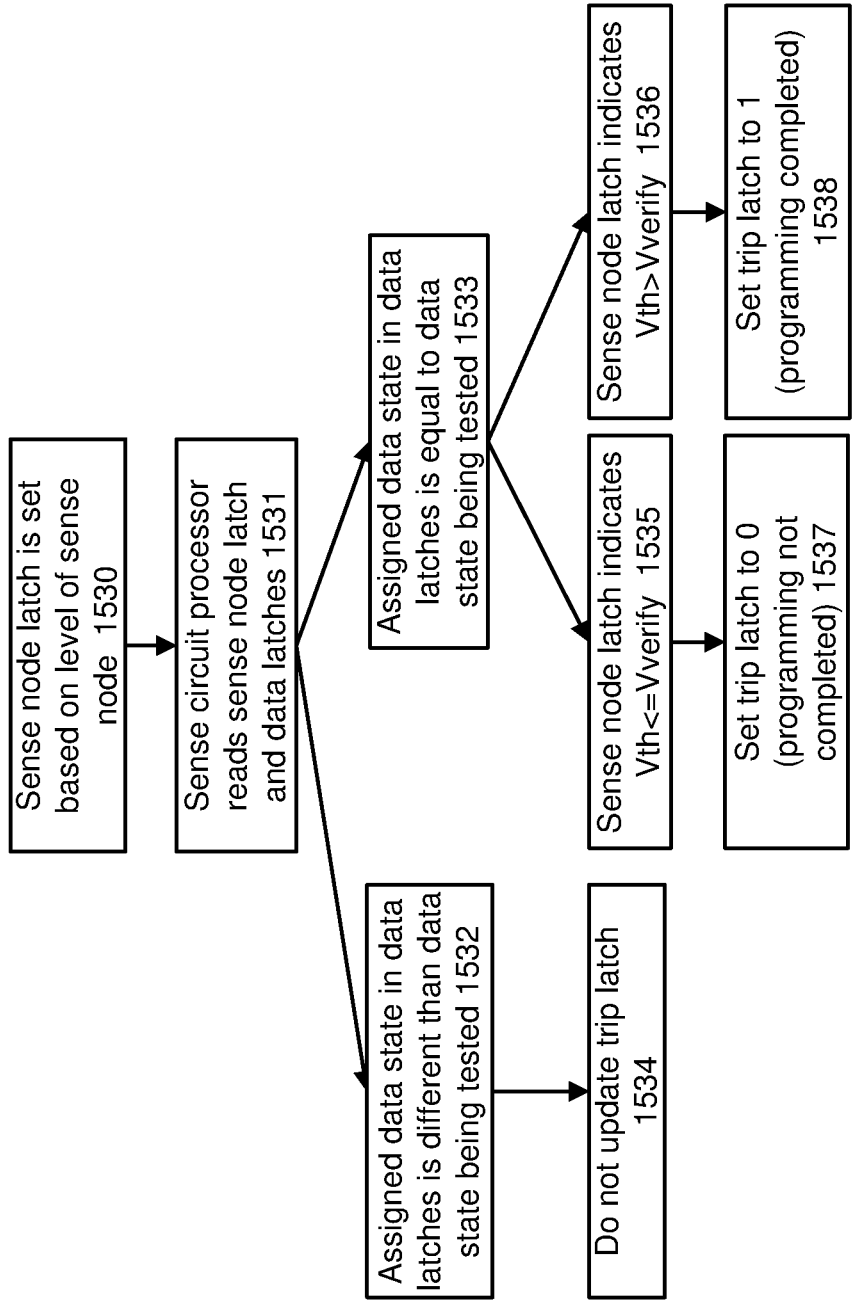
FIG. 15C depicts a process for setting latches in a sense circuit, consistent with step 1505 of FIG. 15A.
Figure 15D:
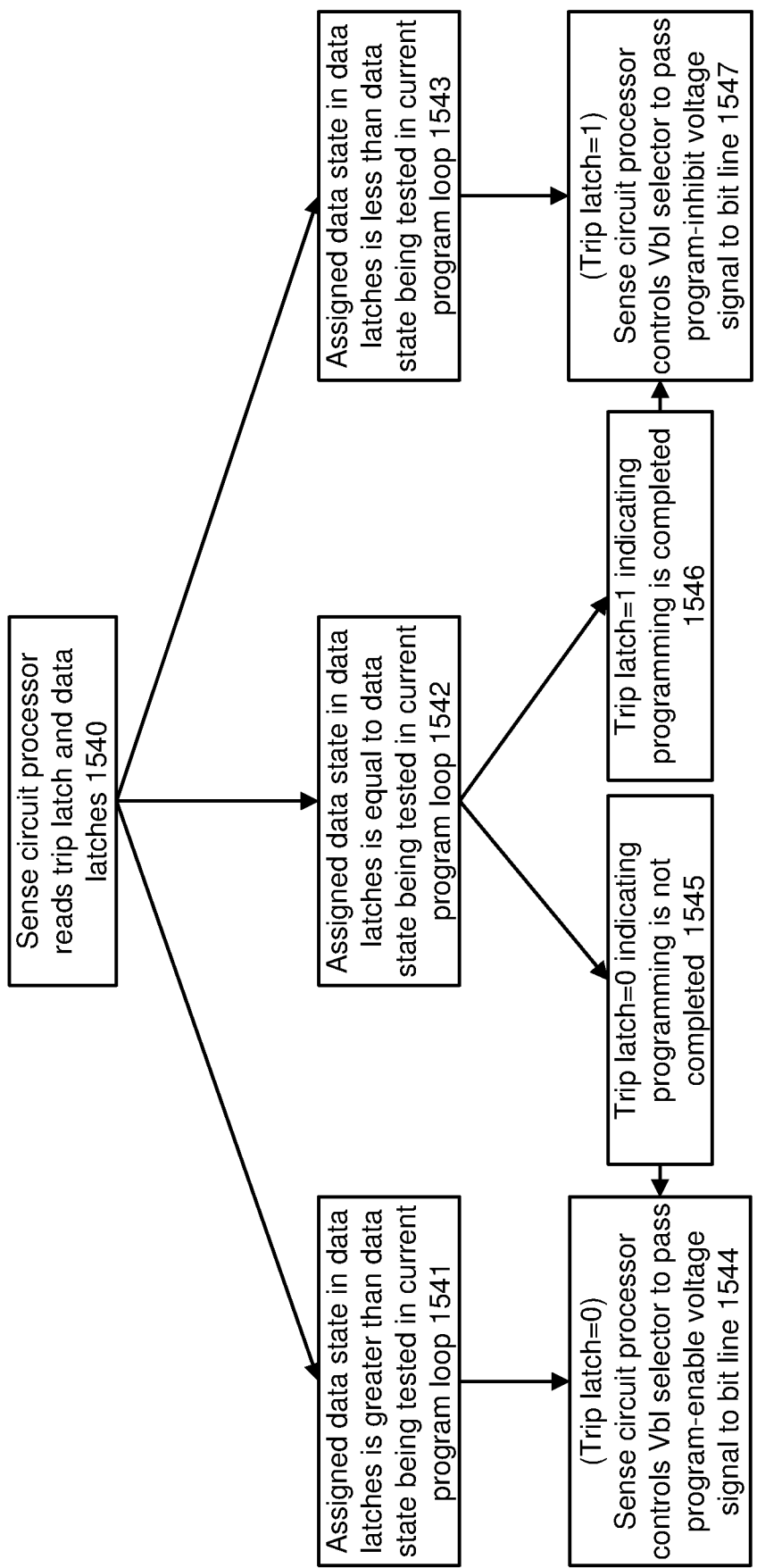
FIG. 15D depicts a process for setting latches in a sense circuit, consistent with step 1507 of FIG. 15A.

The time period 1330 can represent a time in which the sense circuits process data in their latches after a verify test to determine whether programming is completed, consistent with FIG. 15A, step 1505 and with FIG. 15C, and a time in which the sense circuits process data in their latches to identify selected and unselected memory cells for the next program loop based on whether the programming is completed, consistent with FIG. 15A, step 1507 and with FIG. 15D. The time period 1331 can represent a time in which some of the sense circuits continue to process data in their latches. A sense circuit is ready for a next program loop when the data in the latches has been processed and it is known whether to pass the program-enable voltage signal or the program-inhibit voltage signal to a respective bit line.

The first voltage source 440a of FIG. 3A can be used to provide the program-inhibit voltage signal.

FIG. 13A depicts a plot 1300 of a first program-inhibit voltage signal with a relatively early ramp up start time (t0b) and a relatively low transition voltage, e.g., 75%, to reduce program time, and a plot 1305 of a second program-inhibit voltage signal with a relatively late ramp up start time (t0c) and a relatively high transition voltage (90%) to reduce current consumption. The program-inhibit voltage signal can increase initially at a regulated rate by controlling the voltage source to incrementally increase the voltage in successive steps. When the program-inhibit voltage signal reaches a transition voltage, which is a percentage of the final voltage, the program-inhibit voltage signal increases at an unregulated rate by controlling the voltage source to increase the voltage further to the final level in a single step, in one approach. Using a regulated rate over the majority of the ramp up time of the program-inhibit voltage signal helps avoid excessive current consumption.

The first program-inhibit voltage signal (plot 1300) increases at a regulated rate (plots 1300a and 1300b) from t0b-t0d and then at an unregulated rate (plot 1300c) when it reaches 75% of the final level, Vbl_inh at t0d. The second program-inhibit voltage signal (plot 1305) increases at a regulated rate (plot 1305a) from t0c-t0e and then at an unregulated rate (plot 1305b) when it reaches 90% of the final level, Vbl_inh at toe. By increasing the program-inhibit voltage signal from t0b-t0b1, when some of the sense circuits are still busy processing data in their latches, the final level is reached relatively sooner so that a time savings is achieved. Also, using a relatively low transition voltage helps the program-inhibit voltage reach its final level sooner so that a further time savings is achieved, at a cost of higher current consumption at t0d. The increase in power consumption at t0d is acceptable since it is after the sense circuits have completed the processing of the data in their latches at t0b1.

The program-inhibit voltage signal is not passed to an unselected bit line of a NAND string by the Vbl selector 173 of FIG. 2 until the respective sense circuit has completed processing the data and determines that the memory cell in the NAND string, connected to the selected word line, is to be inhibited from programming. For example, if the sense circuit completes the processing of the data before t0b, the voltage signal of plots 1300a and 1300b will be passed to the respective bit line starting at t0b. In this case, the completion of the processing of the data by a sense circuit before the specified time of t0b results in passing the program-inhibit voltage signal to the respective bit line at the specified time t0b. If the sense circuit completes the processing of the data after the specified time t0b, e.g., at t0b1, the signal of plots 1300c and 1300b will be passed to the respective bit line starting at t0b1. In this case, the completion of the processing of the data by the sense circuit at a given time triggers the passing of the program-inhibit voltage signal to the respective bit line at the given time. The passing of the program-inhibit voltage signal to the respective bit line can occur at different times in different sense circuits.

The plot 1300 can represent a dynamic inhibit mode, where the passing of the program-inhibit voltage signal to the bit line can occur dynamically in response a sense circuit configuring the trip latch 174 to indicate whether the associated memory cell is to be inhibited from programming, or, more generally, completing preparations for a next program loop. Recall that some of the sense circuit complete the configuring before t0b while other sense circuits complete the configuring between t0b-t0b1.

Specifically, between t0a-t0b, updating of the respective latches of the sense circuits is completed by one subset of the sense circuits (see, e.g., the subset 790 of FIG. 7B) but not by another subset of the sense circuits (see, e.g., the subset 791 of FIG. 7B). Between t0b-t0b1, updating of the respective latches of the sense circuits is completed by the another subset of the sense circuits. By t0b1, updating of the respective latches of the sense circuits is completed by all of the sense circuits.

In the time period t0b-t0b1, current is consumed by the sense circuits which are active in processing data in preparation for the next program loop. The ramp up of the program-inhibit voltage signal in this time period overlaps with the processing by the sense circuits, thereby consuming additional current but reducing the program time. The overall peak current consumption can still be kept below a maximum allowed level if the overlapping ramp up of the program-inhibit voltage signal is limited to program loops in which the peak current is otherwise relatively low, e.g., the initial and final sets of program loops (see FIG. 12A), due to a relatively low bit line capacitance.

A control circuit can be configured to instruct the voltage source 440a to begin to output the program-inhibit voltage signal after updating of the respective latches is completed by one subset of the sense circuits (e.g., at t0b) and while updating of the respective latches is in progress by another subset of the sense circuits, when the program loop is in an initial set of program loops of the plurality of program loops. The control circuit can also be configured to instruct the voltage source to begin to output the voltage signal after updating of the respective latches is completed by each of the sense circuits (e.g., at t0c) when the program loop is in an intermediate set of program loops of the plurality of program loops.

The plot 1305 can represent a non-dynamic inhibit mode, where the start of the ramp up of the program-inhibit voltage signal and the passing of the program-inhibit voltage signal to the bit line occur at a specified time, e.g., t0c, at which it is known that all of the sense circuits have configured the trip latch 174 to indicate whether the associated memory cell is to be inhibited from programming, or, more generally, at a time at which it is known that preparations have been completed by all of the sense circuits for a next program loop.

With the plot 1305, the ramp up of the program-inhibit voltage signal is non-overlapping with the processing by the sense circuits to avoid consuming additional current in program loops in which the peak current is otherwise relatively high, e.g., the intermediate set of program loops (see FIG. 12A). A tradeoff is an increased program time.

Also, using a relatively high transition voltage helps reduce current consumption since the step increase in the current is relatively smaller. That is, an increase from 90% to 100% of Vbl_inh in plot 1305 is smaller than an increase from 75% to 100% of Vbl_inh in plot 1300.

A control circuit can be configured to instruct the voltage source to begin to output the voltage signal sooner (e.g., at t0b instead of t0c) in a program loop which is in an initial set of program loops of the plurality of program loops than in a program loop which is in an intermediate set of program loops of the plurality of program loops.

The control circuit can be configured to instruct the voltage source to begin to output the voltage signal sooner (e.g., at t0b instead of t0c) in a program loop when the program loop is in a final set of program loops of the plurality of program loops than when the program loop is in an intermediate set of program loops of the plurality of program loops.

Each sense circuit comprises a respective latch 174 and is configured to update the respective latch for a program loop to indicate whether the respective memory cell is to be inhibited from programming; and each sense circuit is configured to pass the voltage signal to the respective bit line at a specified time (e.g., t0b) if updating of the respective latch is completed at the specified time, and, if the updating of the respective latch has not been completed at the specified time, to pass the voltage signal to the respective bit line when updating of the respective latch is completed after the specified time (e.g., at a time between t0b-t0b1).

The control circuit can be configured to instruct the voltage source to output the voltage signal with a regulated ramp up rate (e.g., the rate of plots 1300a and 1300b) until the voltage signal reaches a transition voltage (e.g., 75% of Vbl_inh) which is below the program-inhibit voltage (Vbl_inh), after which the voltage signal increases at an unregulated ramp up rate (e.g., the rate of plot 1300c) to the program-inhibit voltage. The transition voltage is based on the position of the program loop in the plurality of program loops (e.g., 75% for the initial and final sets of program loops and 90% for the intermediate sets of program loops).

The transition voltage can be lower in an initial set of program loops of the plurality of program loops than in an intermediate set of program loops of the plurality of program loops. The transition voltage can be lower in a final set of program loops of the plurality of program loops than in an intermediate set of program loops of the plurality of program loops.

It is also possible to not have a transition voltage in which case the voltage signal is fully ramped up the peak level at a regulated rate.

The regulated ramp up rate can be higher in initial and final sets of program loops of the plurality of program loops than in an intermediate set of program loops of the plurality of program loops. See FIG. 13B and the higher rate of the plot 1310 compared to the plot 1315.

FIG. 13B depicts a plot 1310 of a first program-inhibit voltage signal with a relatively high ramp up rate to reduce program time and a plot 1315 of a second program-inhibit voltage signal with a relatively low ramp up rate to reduce current consumption, where both signals have the same start time (t0c) and transition voltage (75%). The non-dynamic inhibit mode is depicted. Generally, the ramp up rate can refer to the rate of the regulated portion of the increase of the program-inhibit voltage signal. The first program-inhibit voltage signal (plot 1310) increases at a regulated rate (plot 1310a) from t0c-t0d1 and then at an unregulated rate (plot 1310b) when it reaches 75% of the final level, Vbl_inh at t0d1. The second program-inhibit voltage signal (plot 1315) increases at a regulated rate (plot 1315a) from t0c-t0e1 and then at an unregulated rate (plot 1315b) when it reaches 75% of the final level at t0e1. This example depicts adjusting the ramp up rate of the program-inhibit voltage signal.

A control circuit can be configured to instruct the voltage source to output the voltage signal at a relatively high ramp up rate (e.g., the rate of plot 1310a instead of the rate of plot 1315a) in a program loop when the program loop is in initial and final sets of program loops of the plurality of program loops and at a relatively low ramp up rate (e.g., the rate of plot 1315a instead of the rate of plot 1310a) when the program loop is in an intermediate set of program loops of the plurality of program loops.

FIG. 13C depicts a plot 1320 first program-inhibit voltage signal with a relatively low transition voltage to reduce program time and a plot 1325 of a second program-inhibit voltage signal with a relatively high transition voltage to reduce current consumption, where both signals have the same start time and ramp up rate. The non-dynamic inhibit mode is depicted. The first program-inhibit voltage signal (plot 1320) increases at a regulated rate (plot 1320a) from t0c-t0d1 and then at an unregulated rate (plot 1320b) when it reaches 75% of the final level, Vbl_inh at t0d1. The second program-inhibit voltage signal (plot 1325) increases at a regulated rate from t0c-t0e2 (see plot 1320a from t0c-t0d1 and plot 1325a from t0d1-t0e2), and then at an unregulated rate (plot 1325b) when it reaches 75% of the final level at t0e2. This example depicts adjusting the transition voltage of the program-inhibit voltage signal.

Figure 14B:
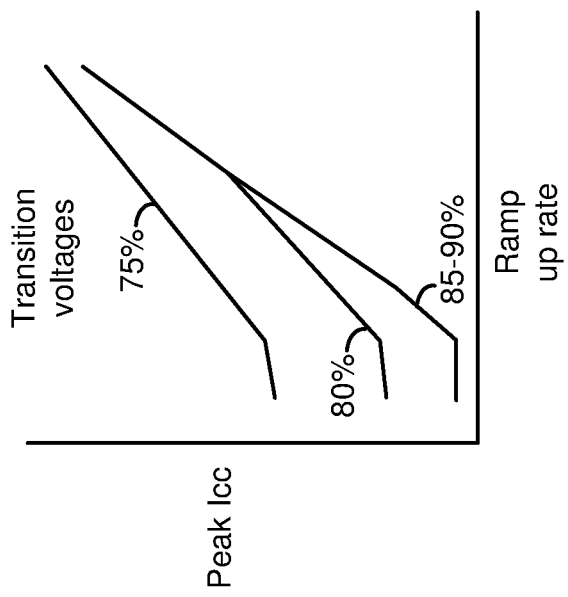
FIG. 14B depicts a plot of peak current consumption as a function of a ramp up rate and a transition voltage, consistent with FIG. 13A-13C.
Figure 14A:
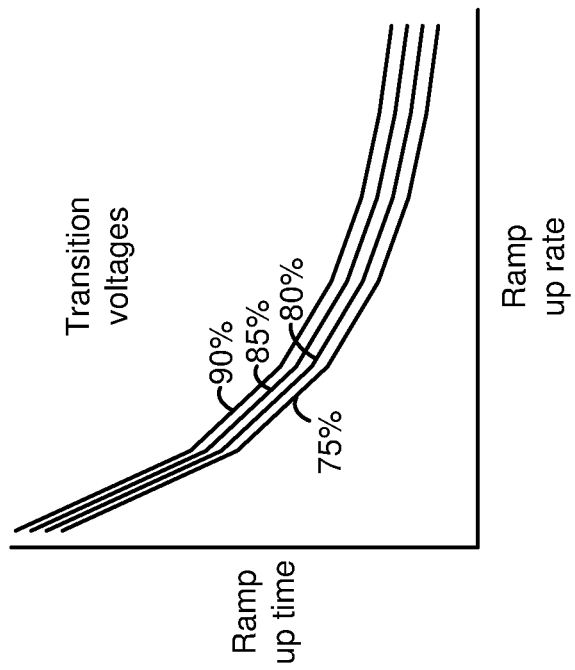
FIG. 14A depicts a plot of a ramp up time as a function of a ramp up rate and a transition voltage, consistent with FIG. 13A-13C.

FIG. 14A depicts a plot of a ramp up time as a function of a ramp up rate and a transition voltage, consistent with FIG. 13A-13C. The ramp up time is lower when the ramp up rate is higher. Additionally, for a given ramp up rate, the ramp up time is lower when the transition voltage is lower. The plots depict transition voltages of 75, 80, 85 and 90% as indicated.

FIG. 14B depicts a plot of peak current consumption as a function of a ramp up rate and a transition voltage, consistent with FIG. 13A-13C. The peak current consumption (peak Icc) is higher when the ramp up rate is higher. Additionally, for a given ramp up rate, the peak Icc is higher when the transition voltage is lower. The plots depict transition voltages of 75, 80, 85 and 90% as indicated. The plots for transition voltages of 85 and 90% overlap at lower ramp up rates and merge with the plot for an 80% transition voltage at higher ramp up rates, indicating the peak current is dominated by the ramp up rate instead of the transition voltage in this example. When the ramp up rate is high, the reduction in current from using a higher transition voltage is relatively small. Adjusting an additional characteristic such as delaying the ramp up start time can achieve the desired reduction in current. There is a tradeoff between reducing peak Icc and reducing program time.

FIG. 15A depicts a process for performing a program operation which optimizes program time and current consumption. A program operation begins at step 1500. Step 1501 includes, for a program loop, determining one or more characteristics of a program-inhibit voltage signal based on a position of the program loop among a plurality of program loops of a program operation and/or a program progress in the program operation. See, e.g., FIG. 15B. The characteristics can include start time, ramp up rate and transition voltage, as discussed. Step 1502 includes applying the program-inhibit voltage signal to the bit lines of the unselected memory cells, and applying a fixed voltage (a program-enable voltage signal), e.g., 0 V, to bit lines of selected memory cells. See FIG. 10 in the pre-charge phase 1007 and the program phase 1008. In the pre-charge phase, the program-inhibit voltage signal pre-charges the channels of the unselected NAND strings. In the program phase, the program-inhibit voltage signal inhibits programming of the memory cells of the unselected NAND strings.

Step 1503 includes applying a program voltage signal to a selected word line and a pass voltage to unselected word lines. See FIG. 10 in the program phase 1008. Step 1504 includes applying a verify voltage signal to the selected word line and a pass voltage to the unselected word lines, and sensing the selected memory cells. See FIG. 10 in the verify phase 1009.

Step 1505 includes updating latches based on the sensing results. See also FIG. 15C. Step 1506 includes outputting the sensing results to the controller. The controller can use the sensing results to determine whether programming has been completed for a particular data state or whether the program operation has been completed. Step 1507 includes processing data in latches to identify selected and unselected memory cells for a next program loop. See also FIG. 15C.

A decision step 1508 determines whether there is a next program loop. If the decision step is true, step 1501 is repeated for the next program loop. If the decision step 1508 is false, the program operation is done at step 1509.

A method consistent with FIG. 15A includes increasing a voltage signal from an initial voltage to a program-inhibit voltage during each program loop of a plurality of program loops of a program operation for memory cells, where the memory cells are connected to respective sense circuits via respective bit lines; and connecting the voltage signal to the respective bit lines at the sense circuits, where the increasing of the voltage signal occurs sooner in each program loop of one set of program loops (e.g., at t0b in FIG. 13A for the initial set of PLs 910 or the final set of PLs 912 in FIG. 9A) of the plurality of program loops than in each program loop of another set of program loops (e.g., at t0c in FIG. 13A the intermediate set of PLs 911) of the plurality of program loops.

A transition between the one set of program loops and the another set of program loops can occur at a predetermined program loop in the plurality of program loops (e.g., at PL=4 in FIG. 9A).

Or, a transition between the one set of program loops and the another set of program loops occurs at a program loop in the plurality of program loops in which a program milestone is reached, as discussed in connection with FIG. 15B The connecting of the voltage signal to the respective bit lines at each sense circuit can comprise configuring a respective selector (e.g., configuring the Vbl selector 173 of FIG. 2 to pass Vbl_unsel); and the connecting of the voltage signal to the respective bit lines occurs before the respective selectors are configured (e.g., at t0b in FIG. 13A) in one or more of the sense circuits in each program loop of the one set of program loops (sets 910, 912 in FIG. 9A) and after the respective selectors are configured (e.g., at t0b1 in FIG. 13A) in each of the sense circuits in each program loop of the another set of program loops (set 911 in FIG. 9A).

The method can further include updating a respective latch (e.g., a trip latch 174 in FIG. 2) in each of the sense circuits to indicate the respective memory cell is to be programmed in the program loop, wherein the increasing of the voltage signal occurs before the updating of the respective latches is completed (e.g., at t0b in FIG. 13A) in one or more of the sense circuits in each program loop of the one set of program loops (sets 910, 912 in FIG. 9A) and after the updating of the respective latches is completed (e.g., at t0b1 in FIG. 13A) in each of the sense circuits in each program loop of the another set of program loops (set 911 in FIG. 9A).

FIG. 15B depicts a process for implementing step 1501 of FIG. 15A to determine characteristics of a program-inhibit voltage signal based on a position of the program loop and/or a program progress of the program operation. The process starts at step 1520. In one option, step 1521 determines a current program loop (PL) number, e.g., 1-15 in FIG. 9A. A decision step 1522 determines if the PL number is greater than X and less than Y, where X and Y are predefined PL numbers. For example, in FIG. 9A, X=3 and Y=10. If the decision step 1522 is true, step 1524 ramps up the program-inhibit voltage signal with a later start time (see, e.g., FIG. 13A, plot 1305 at t0c), lower ramp rate (see, e.g., FIG. 13B, plot 1315) and/or higher transition voltage (see, e.g., FIG. 13A and the 90% transition voltage). The current program loop may be in the intermediate set of program loops. When the decision step 1522 is false, step 1523 ramps up the program-inhibit voltage signal with an early start time (see, e.g., FIG. 13A, plot 1300 at t0b), higher ramp rate (see, e.g., FIG. 13B, plot 1310) and/or lower transition voltage (see, e.g., FIG. 13A and the 75% transition voltage). The current program loop may be in the initial or final set of program loops.

The above option can provide a simpler implementation because the program progress does not have to be tracked.

In another option, step 1525 determines if a program progress for the selected memory cells reaches a first milestone. For example, this could occur when a verify test is first performed for a specified lower data state, such as the B state. If the decision step 1525 is false, step 1523 is reached, where the characteristics of the program-inhibit voltage signal provide a relatively high current consumption. The current program loop may be in the initial set of program loops.

If the decision step 1525 is true, a decision step determines if a program progress for the selected memory cells reaches a second milestone. For example, this could occur when a verify test is first performed for a specified higher data state such as the G state. If the decision step 1526 is true, step 1523 is reached. The current program loop may be in the final set of program loops. If the decision step 1526 is false, step 1524 is reached, where the characteristics of the program-inhibit voltage signal provide a relatively low current consumption. The current program loop may be in the intermediate set of program loops.

Moreover, this milestone can also be a combination of program progress and program loop. For example, the first milestone can be defined as being met in a program loop which is a fixed number of program loops after a program loop in which a specified amount of program progress has been met. For example, the first milestone can be defined as being met in a program loop which is two program loops after a program loop in which the A state verify test begins, and the second milestone can be defined as being met in a program loop which is one program loop after a program loop in which the E state verify test begins.

FIG. 15C depicts a process for setting latches in a sense circuit, consistent with step 1505 of FIG. 15A. See also FIG. 2. At step 1530, the sense node latch 172 is set based on a level of the sense node 171, as determined by the comparison circuit 175. At step 1531, the sense circuit processor 192 reads the sense node latch and data latches. For example, for the sense circuits 60-63, the sense circuit processor 192 reads the data latches 194-197, respectively, which identify the assigned data state of the respective memory cells connected to the sense circuits in respective NAND strings.

In one option, at step 1532, the assigned data state in the latches 194-197 is different than the data state being tested in a verify test. For example, if VvA is applied to the selected word line, the verify test is for the A state. Step 1534 indicates that the trip latch 174 is not updated since the current verify test is not relevant for the respective memory cell.

In another option, at step 1533, the assigned data state in the latches 194-197 is equal to the data state being tested in a verify test. Step 1535 or 1536 is then followed. At step 1535, the sense node latch indicates that Vth<=Vverify for the respective memory cell. That is, the respective memory cell is in a conductive state when the verify voltage is applied to the selected word line. In this case, step 1537 sets the trip latch to, e.g., 0, to indicate that programming is not completed. At step 1536, the sense node latch indicates that Vth>Vverify for the respective memory cell. That is, the respective memory cell is in a non-conductive state. In this case, step 1538 sets the trip latch to, e.g., 1, to indicate that programming is completed.

FIG. 15D depicts a process for setting latches in a sense circuit, consistent with step 1507 of FIG. 15A. See also FIG. 2. At step 1540, a sense circuit processor reads a trip latch 174 and data latches 194-197. In a first option, at step 1541, the assigned data state in the data latches is greater than the data state being tested in the current program loop. For example, the B state is greater than the A state, the C state is greater than the A and B state, and so forth. The greatness of a state is proportional to its verify voltage. Step 1544 indicates that the trip latch=0, indicating the memory cell has not completed programming. The sense circuit processor controls the Vbl selector 173 to pass a program-enable voltage signal, e.g., 0 V, to the bit line.

In a second option, step 1542 indicates that the assigned data state in the data latches is equal to the data state being tested in the current program loop. In a first case, step 1545 indicates that the trip latch=0, indicating that programming is not completed for the memory cell. Step 1544 is then followed. In a second case, step 1546 indicates that the trip latch=1, indicating that programming is completed for the memory cell. In this situation, the memory cell has completed programming in the current program loop so it is inhibited from further programming Step 1547 is then followed, where the sense circuit processor controls the Vbl selector 173 to pass the program-inhibit voltage signal to the bit line.

In a third option, step 1543 indicates that the assigned data state in the data latches is less than the data state being tested in the current program loop. For example, the A state is less than the B state, and the A and B states are less than the C state. Step 1547 is then reached. In this situation, the memory cell would have completed programming in a previous program loop so it is inhibited from further programming. At step 1547, the trip latch=1, indicating the memory cell has completed programming, and the sense circuit processor controls the Vbl selector 173 to pass the program-inhibit voltage signal to the bit line.

The processes of FIGS. 15C and 15D can be performed for each sense circuit in a block generally concurrently. However, the processing can be completed at different times in different sense circuits, as discussed in connection with FIG. 13A-13C. This is due to some serial processing involving the sense circuits. For example, outputting of sensing results to the controller at step 1506 of FIG. 15A is performed serially. The processor 192 of FIG. 2 may also communicate serially with the individual sense circuits 60-63.

The reading of the latches in FIGS. 15C and 15D is also referred to as scanning of the latches.

Accordingly, it can be see that in one implementation, an apparatus comprises: a set of memory cells arranged in a set of NAND strings; a set of bit lines, each bit line connected to a respective NAND string in the set of NAND strings; sense circuits connected to respective memory cells in the set of memory cells via a respective bit line in the set of bit lines, each sense circuit is configured to pass a voltage signal to the respective bit line in a program loop of a program operation when the respective memory cell is to be inhibited from programming; a voltage source connected to the sense circuits and configured to output the voltage signal, the voltage signal starts at an initial voltage and increases to a program-inhibit voltage; and a control circuit connected to the voltage source and the sense circuits, the control circuit is configured to instruct the voltage source to begin to output the voltage signal at a time in the program loop which is based on a position of the program loop among a plurality of program loops in the program operation.

In another implementation, a method comprises: increasing a voltage signal from an initial voltage to a program-inhibit voltage during each program loop of a plurality of program loops of a program operation for memory cells, the memory cells are connected to respective sense circuits via respective bit lines; and connecting the voltage signal to the respective bit lines at the sense circuits, the increasing of the voltage signal occurs sooner in each program loop of one set of program loops of the plurality of program loops than in each program loop of another set of program loops of the plurality of program loops.

In another implementation, an apparatus comprises: a set of memory cells arranged in a set of NAND strings; a set of bit lines, each bit line connected to a respective NAND string in the set of NAND strings; a voltage source configured to increase a voltage signal from an initial voltage to a program-inhibit voltage; and sense circuits connected to respective memory cells in the set of memory cells via a respective bit line in the set of bit lines, each sense circuit comprises means for connecting a program-inhibit voltage signal to the respective bit line during a program loop of a program operation when the respective memory cell is to be inhibited from programming, wherein: the voltage source is configured to begin to increase the program-inhibit voltage signal at a first time for a program loop when the program loop is in one set of program loops of a plurality of program loops of the program operation, and at a second time for the program loop when the program loop is in another set of program loops of the plurality of program loops, wherein the first time is before the second time.

The means for connecting a program-inhibit voltage signal to the respective bit line can be implemented by a microprocessor, microcontroller, state machine, FPGA or other type of processor in combination with control logic performing the processes of FIG. 15A, step 1502. In some embodiments, the means for connecting a program-inhibit voltage signal to the respective bit line may comprise the circuitry of FIG. 2, including the sense circuits 60-63 and the managing circuit 190. In some embodiments, the means for connecting a program-inhibit voltage signal to the respective bit line may comprise the Vbl selector 173.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising;
a set of memory cells arranged in a set of NAND strings;
a set of bit lines, each bit line connected to a respective NAND string in the set of NAND strings;
sense circuits connected to respective memory cells in the set of memory cells via a respective bit line in the set of bit lines, each sense circuit is configured to pass a voltage signal to the respective bit line in a program loop of a program operation to inhibit the respective memory cell from programming;
a voltage source connected to the sense circuits and configured to output the voltage signal to inhibit programming, the voltage signal starts at an initial voltage and increases to a program-inhibit voltage; and
a control circuit connected to the voltage source and the sense circuits, the control circuit is configured to instruct the voltage source to begin to output the voltage signal at a time with respect to a start of the program loop which is based on a position of the program loop among a plurality of program loops in the program operation, to begin to output the voltage signal sooner in a program loop which is in an initial set of program loops of the plurality of program loops than in a program loop which is in an intermediate set of program loops of the plurality of program loops.

2. The apparatus of claim 1, wherein:
each sense circuit comprises a respective latch and is configured to update the respective latch to indicate whether the respective memory cell is to be inhibited from programming in a program loop;
the control circuit is configured to instruct the voltage source to begin to output the voltage signal after updating of the respective latches is completed by one subset of the sense circuits and while updating of the respective latches is in progress by another subset of the sense circuits when the program loop is in an initial set of program loops of the plurality of program loops; and
the control circuit is configured to instruct the voltage source to begin to output the voltage signal after updating of the respective latches is completed by each of the sense circuits when the program loop is in an intermediate set of program loops of the plurality of program loops.

3. The apparatus of claim 1, wherein:
the control circuit is configured to cause a transition in timing of the voltage signal from sooner in program loops to later in program loops at a predetermined program loop or at a program loop in which a program milestone is achieved.

4. The apparatus of claim 1, wherein:
the control circuit is configured to instruct the voltage source to begin to output the voltage signal sooner in a program loop when the program loop is in a final set of program loops of the plurality of program loops than when the program loop is in an intermediate set of program loops of the plurality of program loops.

5. The apparatus of claim 1, wherein:
the control circuit is configured to instruct the voltage source to output the voltage signal at a relatively high ramp up rate in a program loop when the program loop is in initial and final sets of program loops of the plurality of program loops and at a relatively low ramp up rate when the program loop is in an intermediate set of program loops of the plurality of program loops.

6. The apparatus of claim 1, wherein:
each sense circuit comprises a respective latch and is configured to update the respective latch for a program loop to indicate whether the respective memory cell is to be inhibited from programming; and
each sense circuit is configured to pass the voltage signal to the respective bit line at a specified time if updating of the respective latch is completed at the specified time, and, if the updating of the respective latch has not been completed at the specified time, to pass the voltage signal to the respective bit line when updating of the respective latch is completed after the specified time.

7. The apparatus of claim 1, wherein:
the control circuit is configured to instruct the voltage source to output the voltage signal with a regulated ramp up rate until the voltage signal reaches a transition voltage which is below the program-inhibit voltage, after which the voltage signal increases at an unregulated ramp up rate to the program-inhibit voltage; and
the transition voltage is based on the position of the program loop in the plurality of program loops.

8. The apparatus of claim 7, wherein:
the transition voltage is lower in an initial set of program loops of the plurality of program loops than in an intermediate set of program loops of the plurality of program loops.

9. The apparatus of claim 7, wherein:
the transition voltage is lower in a final set of program loops of the plurality of program loops than in an intermediate set of program loops of the plurality of program loops.

10. The apparatus of claim 7, wherein:
the regulated ramp up rate is higher in initial and final sets of program loops of the plurality of program loops than in an intermediate set of program loops of the plurality of program loops.

11. A method, comprising:
increasing a voltage signal from an initial voltage to a program-inhibit voltage during each program loop of a plurality of program loops of a program operation for memory cells, the memory cells are connected to respective sense circuits via respective bit lines; and
connecting the voltage signal to the respective bit lines at the sense circuits, the increasing of the voltage signal occurs sooner in each program loop of one set of program loops of the plurality of program loops than in each program loop of another set of program loops of the plurality of program loops with a transition between the one set of program loops and the another set of program loops occurring at a predetermined program loop or at a program loop in which a program milestone is achieved.

12. The method of claim 11, further comprising:
ramping the voltage signal at a first rate in each program loop of the one set of program loops; and
ramping the voltage signal at a second rate in each program loop of the another set of program loops.

13. The method of claim 12, wherein:
the one set of program loops is an initial set of program loops or a final set of program loops and the another set of program loops is an intermediate set of program loops.

14. The method of claim 11, wherein:
the connecting of the voltage signal to the respective bit lines at each sense circuit comprises configuring a respective selector; and
the connecting of the voltage signal to the respective bit lines occurs before the respective selectors are configured in one or more of the sense circuits in each program loop of the one set of program loops and after the respective selectors are configured in each of the sense circuits in each program loop of the another set of program loops.

15. The method of claim 14, further comprising:
updating a respective latch in each of the sense circuits to indicate the respective memory cell is to be programmed in the program loop, wherein the increasing of the voltage signal occurs before the updating of the respective latches is completed in one or more of the sense circuits in each program loop of the one set of program loops and after the updating of the respective latches is completed in each of the sense circuits in each program loop of the another set of program loops.

16. An apparatus, comprising:
a set of memory cells arranged in a set of NAND strings;
a set of bit lines, each bit line connected to a respective NAND string in the set of NAND strings;
a voltage source configured to increase a voltage signal from an initial voltage to a program-inhibit voltage; and
sense circuits connected to respective memory cells in the set of memory cells via a respective bit line in the set of bit lines, each sense circuit comprises means for connecting a program-inhibit voltage signal to the respective bit line during a program loop of a program operation when the respective memory cell is to be inhibited from programming, wherein:
the voltage source is configured to begin to increase the program-inhibit voltage signal at a first time at a first ramp up rate for a program loop when the program loop is in one set of program loops of a plurality of program loops of the program operation, and at a second time at a second ramp up rate that is lower than the first ramp up rate for the program loop when the program loop is in another set of program loops of the plurality of program loops, wherein the first time is before the second time.

17. The apparatus of claim 16, wherein:
the one set of program loops is an initial set of program loops of the plurality of program loops; and
the another set of program loops is an intermediate set of program loops of the plurality of program loops.

18. The apparatus of claim 16, wherein:
the one set of program loops is a final set of program loops of the plurality of program loops; and
the another set of program loops is an intermediate set of program loops of the plurality of program loops.

19. The apparatus of claim 16, wherein:
each sense circuit comprises a respective latch indicating whether the respective memory cell is to be inhibited from programming;
in each sense circuit, the means for connecting the program-inhibit voltage signal to the respective bit line is responsive to the respective latch; and one subset of the sense circuits is configured to update the respective latches during the increasing of the program-inhibit voltage signal when the program loop is in the one set of program loops.

20. The apparatus of claim 19, wherein:

another subset of the sense circuits is configured to complete updating of the respective latches before the increasing of the program-inhibit voltage signal when the program loop is in the one set of program loops.

\* \* \* \* \*